(12) United States Patent
Na et al.

(10) Patent No.: US 11,448,830 B2
(45) Date of Patent: Sep. 20, 2022

(54) PHOTO-DETECTING APPARATUS WITH MULTI-RESET MECHANISM

(71) Applicant: Artilux, Inc., Menlo Park, CA (US)

(72) Inventors: Yun-Chung Na, Hsinchu County (TW); Che-Fu Liang, Hsinchu County (TW); Chien-Lung Chen, Hsinchu County (TW); Yuan-Fu Lyu, Hsinchu County (TW); Yen-Cheng Lu, Hsinchu County (TW)

(73) Assignee: Artilux, Inc., Menlo Park, CA (US)

( * ) Notice: Subject to any disclaimer, the term of this patent is extended or adjusted under 35 U.S.C. 154(b) by 446 days.

(21) Appl. No.: 16/705,240

(22) Filed: Dec. 6, 2019

(65) Prior Publication Data

US 2020/0192032 A1  Jun. 18, 2020

Related U.S. Application Data

(60) Provisional application No. 62/875,941, filed on Jul. 18, 2019, provisional application No. 62/807,250, (Continued)

(51) Int. Cl.
*G02B 6/35* (2006.01)
*G02B 6/42* (2006.01)
*H04N 5/3745* (2011.01)

(52) U.S. Cl.
CPC ......... *G02B 6/3582* (2013.01); *G02B 6/4292* (2013.01); *H04N 5/3745* (2013.01)

(58) Field of Classification Search
CPC ... G02B 6/3582; G02B 6/4292; H04N 5/3745
See application file for complete search history.

(56) References Cited

U.S. PATENT DOCUMENTS 4,789,964 A * 12/1988 Krilic .................. G11C 7/005
365/115
7,495,202 B2  2/2009 Schrey et al.
(Continued)

FOREIGN PATENT DOCUMENTS

CN        1866531     11/2006
CN      101800837      8/2010
(Continued)

OTHER PUBLICATIONS

Bamji et al., "A 0.13 μm CMOS System-on-Chip for a 512×424 Time-of-Flight Image Sensor With Multi-Frequency Photo-Demodulation up to 130 MHz and 2 GS/s ADC," IEEE J. Solid-State Circuits, Jan. 2015, 50(1):303-319.
(Continued)

*Primary Examiner* — Kevin K Pyo
*Assistant Examiner* — Don J Williams
(74) *Attorney, Agent, or Firm* — Fish & Richardson P.C.

(57) ABSTRACT

A photo-detecting apparatus includes an optical-to-electric converter, having a first output terminal, configured to convert an incident light to an electrical signal; a cascode transistor, having a control terminal, a first channel terminal and a second channel terminal, wherein the second channel terminal of the cascode transistor is coupled to the first output terminal of the optical-to-electric converter; and a reset transistor, having a control terminal, a first channel terminal and a second channel terminal, wherein the first channel terminal of the reset transistor is coupled to a supply voltage and the second channel terminal of the reset transistor is coupled to the first channel terminal of the cascode transistor.

17 Claims, 30 Drawing Sheets

Related U.S. Application Data filed on Feb. 19, 2019, provisional application No. 62/778,291, filed on Dec. 12, 2018.

(56) References Cited

U.S. PATENT DOCUMENTS

| | | | |
|---|---|---|---|
| 7,629,661 | B2 | 12/2009 | Rafferty et al. |
| 7,750,958 | B1 | 7/2010 | Dierickx |
| 7,884,310 | B2 | 2/2011 | Buettgen |
| 8,378,398 | B2 | 2/2013 | Doan et al. |
| 8,405,823 | B2 | 3/2013 | Pfaff |
| 8,860,083 | B1 | 10/2014 | Trezza |
| 9,419,044 | B2 | 8/2016 | Yang et al. |
| 10,418,407 | B2 | 9/2019 | Na et al. |
| 10,707,260 | B2 | 7/2020 | Na et al. |
| 10,861,888 | B2 | 12/2020 | Na et al. |
| 10,964,742 | B2 | 3/2021 | Na et al. |
| 2003/0127672 | A1 | 7/2003 | Rahn |
| 2006/0221452 | A1* | 10/2006 | Chen ............... B60R 1/088 359/266 |
| 2007/0290763 | A1 | 12/2007 | Partridge et al. |
| 2010/0194956 | A1* | 8/2010 | Yuan ............... H04N 5/35527 348/308 |
| 2011/0018625 | A1 | 1/2011 | Hodel |
| 2012/0044398 | A1 | 2/2012 | Chou et al. |
| 2012/0181589 | A1 | 7/2012 | Zhu et al. |
| 2013/0119234 | A1 | 5/2013 | Lee et al. |
| 2013/0280879 | A1 | 10/2013 | Stecher et al. |
| 2014/0002700 | A1 | 1/2014 | Oishi |
| 2014/0054736 | A1 | 2/2014 | Meade et al. |
| 2014/0111664 | A1 | 4/2014 | Kumano |
| 2014/0117428 | A1 | 5/2014 | Lee et al. |
| 2014/0312206 | A1 | 10/2014 | Okhonin et al. |
| 2015/0281618 | A1 | 10/2015 | Saito |
| 2016/0150174 | A1 | 5/2016 | Hynecek |
| 2016/0155883 | A1 | 6/2016 | Shi et al. |
| 2016/0316159 | A1 | 10/2016 | Yoneda |
| 2017/0040361 | A1 | 2/2017 | Ikeda et al. |
| 2017/0040362 | A1 | 2/2017 | Na et al. |
| 2017/0068319 | A1 | 3/2017 | Viswanathan |
| 2017/0142362 | A1 | 5/2017 | Liu |
| 2018/0151732 | A1 | 5/2018 | Mebandru et al. |
| 2018/0233521 | A1 | 8/2018 | Na et al. |
| 2018/0233528 | A1 | 8/2018 | Na et al. |
| 2018/0247968 | A1 | 8/2018 | Na et al. |
| 2019/0081095 | A1 | 5/2019 | Hanzawa et al. |
| 2019/0267507 | A1 | 8/2019 | Takeuchi et al. |
| 2019/0348463 | A1 | 11/2019 | Na et al. |
| 2020/0161364 | A1 | 5/2020 | Na et al. |
| 2020/0400797 | A1 | 12/2020 | Liang |
| 2021/0022592 | A1 | 7/2021 | Na et al. |

FOREIGN PATENT DOCUMENTS

| | | |
|---|---|---|
| CN | 108470742 | 8/2010 |
| CN | 101902583 | 12/2010 |
| CN | 103929600 | 7/2014 |
| CN | 102446940 | 10/2014 |
| CN | 104535179 | 9/2016 |
| CN | 109270547 | 1/2019 |
| JP | 2003-051988 | 2/2003 |
| JP | 2011-066097 | 3/2011 |
| TW | 201508938 | 3/2015 |
| TW | 201541624 | 11/2015 |
| TW | 201640663 | 11/2016 |
| WO | 2014/192989 A1 | 12/2014 |
| WO | WO 2016/077791 | 5/2016 |
| WO | WO 2016/208215 | 12/2016 |
| WO | WO 2017/015580 | 1/2017 |
| WO | WO 2017/024121 | 2/2017 |
| WO | WO 2017/035447 | 3/2017 |
| WO | WO 2018021126 | 2/2018 |

OTHER PUBLICATIONS

Bandaru et al., "Fabrication and characterization of low temperature (<450 °C) grown p-Ge/n-Si photodetectors for silicon based photonics." Materials Science and Engineering B, 2004, 113:79-84.

Bianco et al., "A Comparative Analysis between Active and Passive Techniques for Underwater 3D Reconstruction of Close-Range Objects," Sensors, Aug. 20, 2013, 13(8): 11007-11031.

Chen et al., "Self-Aligned Microbonded Germanium Metal-Semiconductor-Metal Photodetectors Butt-Coupled to Si Waveguides," IEEE J. Sel. Top. Quant. Electron., Nov. 2014, 20(6):3800605, 5 pages.

Dalla Betta et al., "Design and Characterization of Current-Assisted Photonic Demodulators in 0.18-pm CMOS Technology ," IEEE Trans. Electron. Dev., Jun. 2011, 58(6):1702-1709.

EP Extended European Search Report in European Application No. 19215415.1, dated Apr. 21, 2020, 6 pages.

Feng et al., "Vertical p-i-n germanium photodetector with high external responsivity integrated with large core Si waveguides," Optics Express, Jan. 4, 2010, 18(1):96-101.

Foix et al., "Lock-in Time-of-Flight (ToF) Cameras: A Survey," IEEE Sensors J., Sep. 2011, 11(9):1917-1926.

Geng, "Structured-light 3D surface imaging: a tutorial," Advances in Optics and Photonics. Jun. 30, 2011, 3(2): 128-160.

Hutchinson et al., "High-Resolution Aliasing-Free Optical Beam Steering," Optica, vol. 3, No. 8, dated Aug. 5, 2016, 4 pages.

Joo et al., "High-sensitivity 10 Gbps Ge-on-Si photoreceiver operating at λ~1.55 μm," Optics Express, Aug. 2, 2010, 18(16):16474-16479.

Kato et al., "320×240 Back-Illuminated 10-μm CAPD Pixels for High-Speed Modulation Time-of-Flight CMOS Image Sensor," IEEE J. Solid-State Circuits, Apr. 2018, 53(4):1071-1078.

Kawahito et al., "A CMOS Time-of-Flight Range Image Sensor With Gates-on-Field-Oxide Structure," IEEE Sensors J., Dec. 2007, 7(12):1578-1586.

Kim et al., "A Three-Dimensional Time-of-Flight CMOS Image Sensor With Pinned-Photodiode Pixel Structure." IEEE Electron. Dev. Lett., Nov. 2010, 31(11):1272-1274.

Koester et al., "Ge-on-SOI-Detector/Si-CMOS-Amplifier Receivers for High-Performance Optical-Communication Applications," J. Lightw. Technol., Jan. 2001, 25(1):46-57.

Lange et al., "Solid-State Time-of-Flight Range Camera," IEEE J. Quant. Electron., Mar. 2001, 37(3):390-397.

Li et al., "High-Bandwidth and High-Responsivity Top-Illuminated Germanium Photodiodes for Optical Interconnection," IEEE Trans. Electron Dev., Mar. 2013, 60(3):1183-1187.

Lischke et al., "High bandwidth, high responsivity waveguide-coupled germanium p-i-n photodiode," Optics Express, Oct. 19, 2015, 23(21):272.13-27220.

Liu et al., "Backside-incidence critically coupled Ge on SOI photodetector," Proc. SPIE 10100, Optical Components and Materials, Feb. 16, 2017, XIV, 101001X, 6 pages.

Michel et al., "High-performance Ge-on-Si photodetectors," Nature Photon., Jul. 30, 2010, 4:527-534.

Morse et al., "Performance of Ge-on-Si p-i-n Photodetectors for Standard Receiver Modules," IEEE Photon. Technol. Lett., Dec. 1, 2006, 18(23):2442-2444.

Perenzoni et al., "Compact SPAD-Based Pixel Architectures for Time-Resolved Image Sensors," Sensors, May 23, 2016, 16(5):745, 12 pages.

Rafferty et al., "Monolithic germanium SWIR imaging array." 2008 IEEE Conference on Technologies for Homeland Security, Waltham, MA, May 12, 2008, p. 577-582.

Ringbeck et al., "Multidimensional measurement by using 3-D PMD sensors," Adv. Radio Sci., Jan. 1, 2007, 5:135-146.

Tseng et al., "High-performance silicon-on-insulator grating coupler with completely vertical emission," Optics Express, Sep. 21, 2015, 23(19):24433-9.

Tseng et al., "A self-assembled microbonded germanium/silicon heterojunction photodiode for 25 GB/s high-speed optical interconnects," Sci. Rep., Nov. 15, 2013, 3:3225, 6 pages.

(56) References Cited

OTHER PUBLICATIONS

Van Der Tempel et al., "Lock-in Pixel Using a Current-Assisted Photonic Demodulator Implemented in 0.6 μm Standard Complementary Metal-Oxide-Semiconductor," Jpn. J. Appl. Phys., Apr. 24, 2017 46(4B):2377-2380.

Van Nieuwenhove et al., "Photonic Demodulator With Sensitivity Control," IEEE Sensors J., Mar. 2007, 7(3):317-318.

Wu et al., "A critically coupled Germanium photodetector under vertical illumination," Opt. Express, Dec. 31, 2012, 20(28):29338-29346.

Yin et al., "31GHz Ge n-i-p waveguide photodetectors on Silicon-on-Insulator substrate," Optics Express, Oct. 17, 2007, 15(21):13965-13971.

Yokogawa et al., "IR sensitivity enhancement of CMOS Image Sensor with diffractive light trapping pixels," Sci. Rep., Jun. 19, 2017, 7(1):3832, 9 pages.

Office Action in Chinese Appln. No. 201911267503.4, dated Jun. 30, 2022, 18 pages (with English translation).

\* cited by examiner

PHOTO-DETECTING APPARATUS WITH MULTI-RESET MECHANISM

CROSS REFERENCE TO RELATED APPLICATIONS

This patent application claims the benefit of U.S. Provisional Patent Application No. 62/778,291, filed Dec. 12, 2018, U.S. Provisional Patent Application No. 62/807,250, filed Feb. 19, 2019, U.S. Provisional Patent Application No. 62/875,941, filed Jul. 18, 2019, which are incorporated by reference herein.

BACKGROUND OF THE INVENTION

1. Field of the Invention

The present invention relates to a photo-detecting apparatus, and more particularly, to a photo-detecting apparatus with a multi-reset mechanism.

2. Description of the Prior Art

Photo-detecting apparatus may be used to detect incident light and convert the incident light to electrical signal that may be further processed by another circuitry. Photodetectors may be used in consumer electronics products, image sensors, data communications, time-of-flight (ToF), light detection and ranging (LiDAR), medical devices, and many other suitable applications. However, when photodetectors are applied to these applications in a single or array configuration, the leakage current and dark current may degrade performances such as increasing the power consumption and reducing the signal to noise ratio.

SUMMARY OF THE INVENTION

According to a first aspect of the present application, a photo-detecting apparatus is provided. The photo-detecting apparatus includes an optical-to-electric converter, having a first output terminal, configured to convert an incident light to an electrical signal; a cascode transistor, having a control terminal, a first channel terminal and a second channel terminal, wherein the second channel terminal of the cascode transistor is coupled to the first output terminal of the optical-to-electric converter; and a reset transistor, having a control terminal, a first channel terminal and a second channel terminal, wherein the first channel terminal of the reset transistor is coupled to a supply voltage and the second channel terminal of the reset transistor is coupled to the first channel terminal of the cascode transistor.

In a further aspect of the present application, the optical-to-electric converter includes a light-absorption material formed on a semiconductor substrate, wherein the light absorption material is a material different from the semiconductor substrate.

In a further aspect of the present application, the optical-to-electric converter includes a photodiode configured to convert the incident light to the electrical signal; and a switch configured to output the electrical signal at the first output terminal according to a switch signal.

In a further aspect of the present application, the first output terminal of the optical-to-electric converter is substantially operated at a constant voltage.

In a further aspect of the present application, wherein the control terminal of the reset transistor is configured to receive a reset signal, the resetting times of the reset signal is equal to or greater than two during a formation of a subframe.

In a further aspect of the present application, the photo-detecting apparatus is configured to form a final 3D frame, wherein the final 3D frame is obtained according to a plurality of subframes.

Among other advantages and benefits of the embodiments disclosed herein, the embodiments provide a photo-detecting apparatus capable of absorbing a least a near-infrared (NIR) light or a short-wave infrared (SWIR) light efficiently. In some embodiments, the photo-detecting apparatus may have smaller chip size, low dark current and/or higher accuracy of the 3D image depth information, and low leakage current and/or lower consumption of the 3D image sensor power.

These and other objectives of the present disclosure will become obvious to those of ordinary skill in the art after reading the following detailed description of the alternative embodiments that are illustrated in the various figures and drawings.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The foregoing aspects and many of the attendant advantages of this application will become more readily appreciated as the same becomes better understood by reference to the following detailed description, when taken in conjunction with the accompanying drawings, wherein:

FIG. 2A-FIG. 2D-4 illustrate the photo-detecting apparatuses and photo-detecting methods using two-tap configurations, according to some embodiments.

DETAILED DESCRIPTION

General Structure of One-Tap Configuration

Figure 1A:
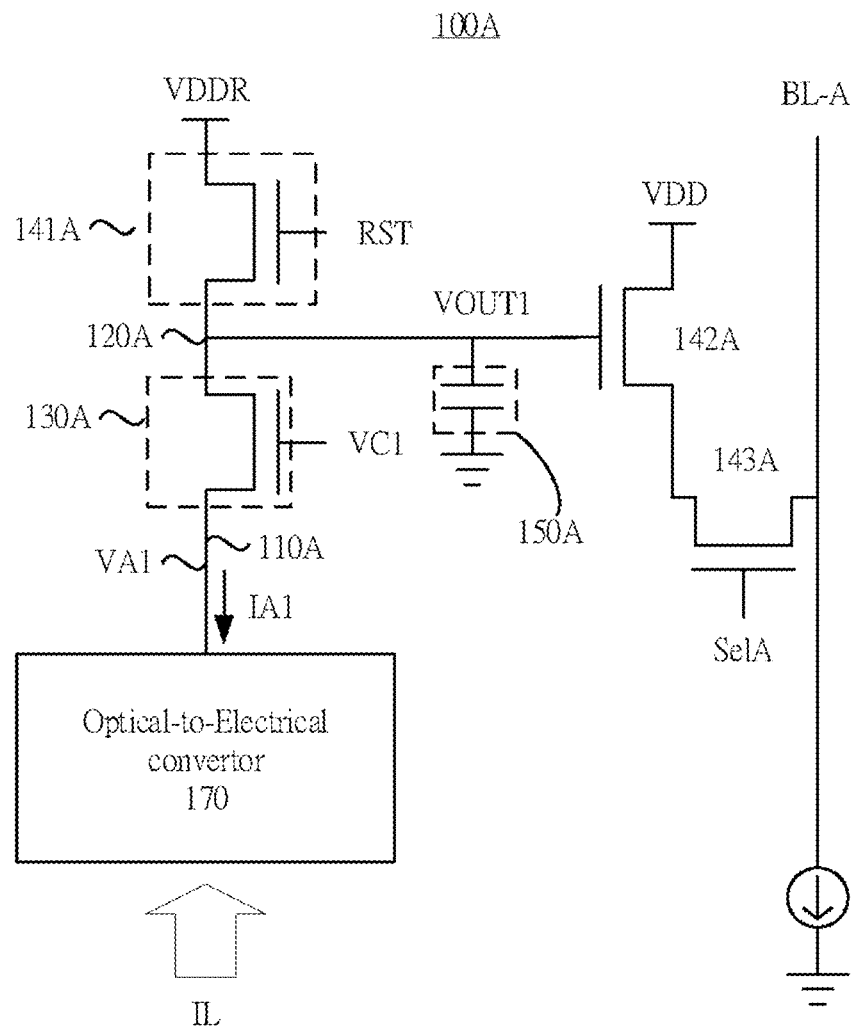
FIG. 1A-FIG. 1J-4 illustrate the photo-detecting apparatuses and photo-detecting methods using one-tap configurations, according to some embodiments.

FIG. 1A illustrates a photo-detecting apparatus 100A with one-tap configuration, according to some embodiments. The photo-detecting apparatus 100A includes an optical-to-electric converter 170, a cascode transistor 130A, a reset transistor 141A, a source-follower transistor 142A, a row-select transistor 143A, a capacitor 150A and a bit-line BL-A.

The optical-to-electric converter 170 is configured to convert an incident light IL to an electrical signal IA1 at an output terminal 110A, where the electrical signal IA1 is a photo-current. There are many implementations for the optical-to-electric converter 170, the details will be described hereinafter. The cascode transistor 130A is coupled between the optical-to-electric converter 170 and the reset transistor 141A. Specifically, one channel terminal (e.g., source terminal) of the cascode transistor 130A is coupled to the output terminal 110A of the optical-to-electric converter 170 and the other channel terminal (e.g., drain terminal) of cascode transistor 130A is coupled to one channel terminal (e.g., source terminal) of the reset transistor 141A. In some implementations, cascode transistor 130A, reset transistor 141A, source-follower transistor 142A and row-select transistor 143A can be implemented by NMOS transistors or PMOS transistors.

During operation of the photo-detecting apparatus 100A, the channel terminal 120A on the capacitor 150A is charged to a reset voltage VDDR through the reset transistor 141A. For example, by applying a reset signal RST that causes the reset transistor 141A to operate in the saturation or triode region, a current will flow through the reset transistor 141A onto the capacitor 150A and charge the capacitor 150A to the reset voltage VDDR. Notably, the reset voltage VDDR can be the same or different with the supply voltage VDD.

Once the charging is completed, an integration of the electrical signal IA1 generated by the optical-to-electric converter 170 may begin. The cascode transistor 130A can be controlled to initiate and terminate the integration through a control voltage Vc1 generated on the gate terminals of the cascode transistor 130A. For example, the control voltage Vc1 may be set to operate the cascode transistor 130A in the subthreshold or saturation region so that the voltage VA1 generated at terminal 110A can be maintained at a nearly constant bias. As the voltage VA1 generated at terminal 110A is stable and relatively low, the dark current generated by the optical-to-electric converter 170 can be suppressed.

One-Tap ToF Application

Figure 1B:
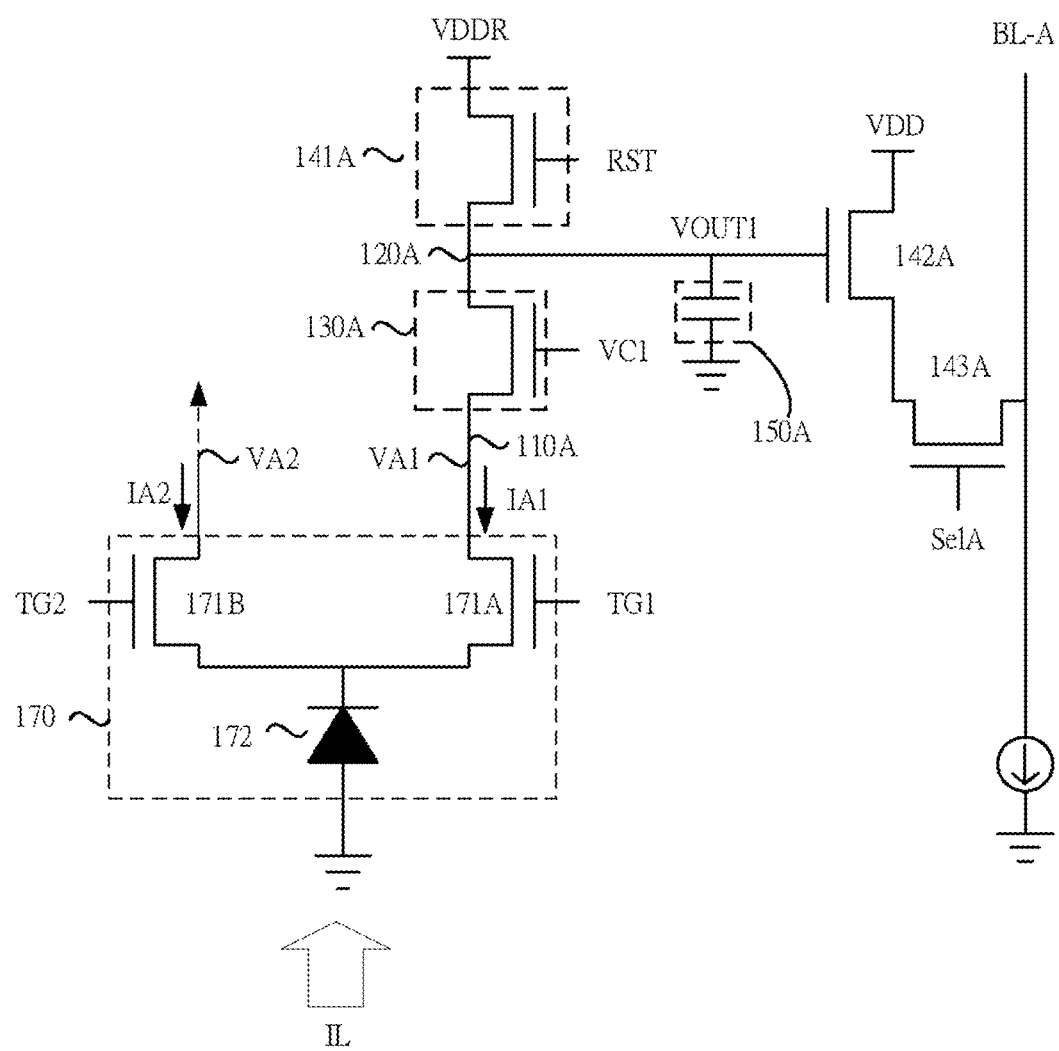

FIG. 1B illustrates a photo-detecting apparatus 100B with one-tap configuration, which is used in ToF application. Specifically, this embodiment shows a configuration of the optical-to-electric converter 170, including a photodiode 172, switch 171A and 171B.

In accordance with this embodiment, applying a switch signal TG1 greater than the threshold voltage of the switch 171A while applying a switch signal TG2 lower than the threshold voltage of switch 171B, the photo-generated carriers generated by the photodiode 172 will be directed to flow through the switch 171A and the cascode transistor 130A. Contrarily, applying a switch signal TG2 greater than the threshold voltage of the switch 171B while applying a switch signal TG1 lower than the threshold voltage of switch 171A, the photo-generated carriers generated by the photodiode 172 will be directed to flow through the switch 171B.

In more detail, the switch signal TG1 and the switch signal TG2 are demodulation signals. In one implementation, the switch signal TG1 and the switch signal TG2 are differential to each other. In another implementation, the switch signal TG1 and the switch signal TG2 use clock signals with a 50% duty cycle. In other possible implementations, the duty cycle can be different (e.g., 30% duty cycle). In some implementations, square wave is used as the modulation and demodulation signals. In some implementations, sinusoidal wave is used as the modulation and demodulation signals instead of square wave.

During integration operation, the capacitor 150A will be discharged when the switch signal TG1 turns-on the switch 171A and the incident light IL comes in. After a predetermined time of integration, the output voltage VOUT1 will be dropped to a settled value. According to a selecting signal SelA, this settled value will be read-out onto the bit-line BL-A through the follower transistor 142A and row-select transistor 143A. By repeating the above procedure but with different modulation and/or demodulation phases, the system can determine a distance between a target object and the photo-detecting apparatus 100B.

One-Tap ToF Application with Detailed Voltage Generator

Figure 1C:
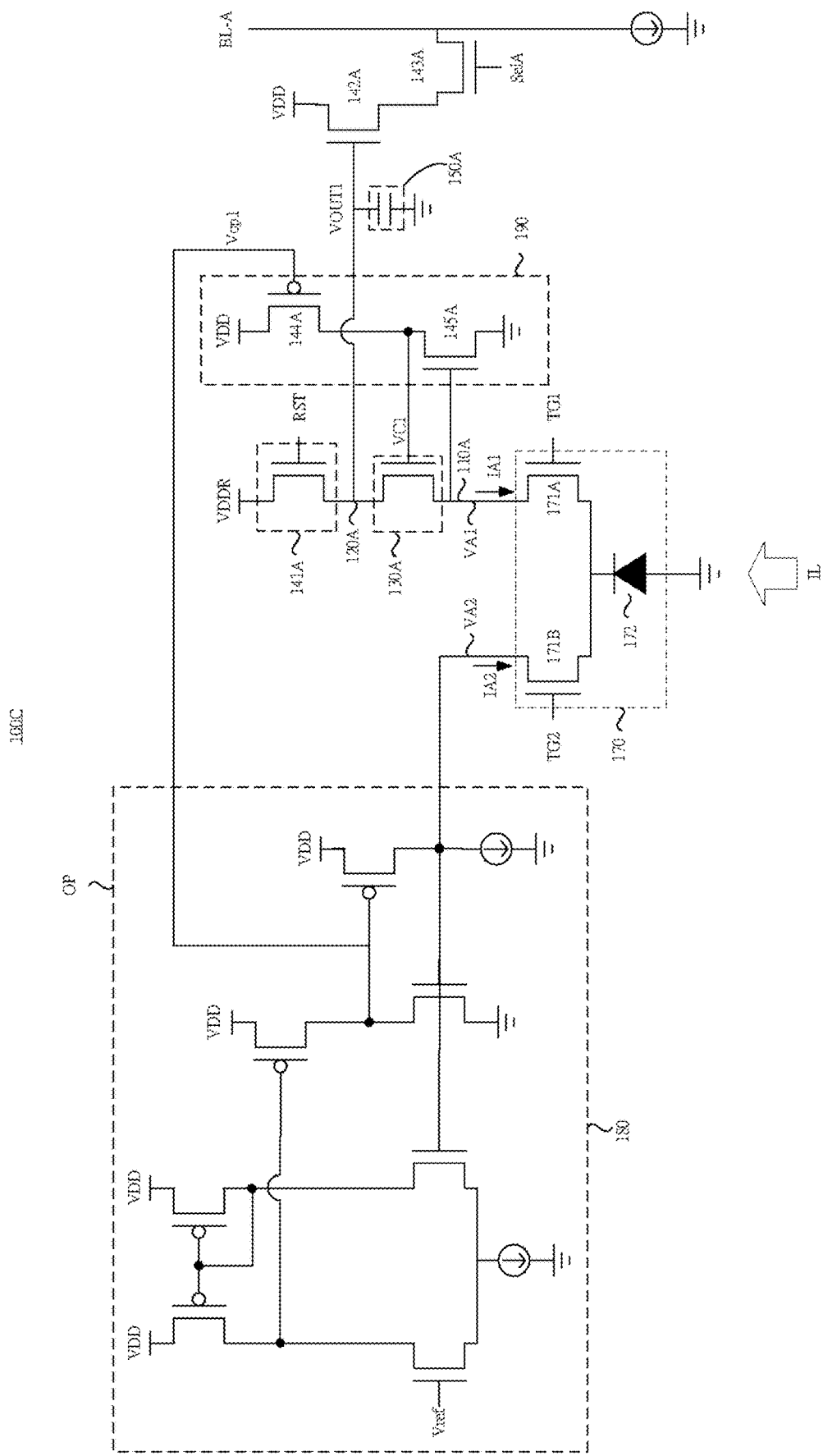

In order to maintain the voltages VA1 and VA2 at a nearly constant bias, a voltage generator is implemented. Please refer to FIG. 1C, which illustrates an embodiment of a photo-detecting apparatus 100C with a voltage generator 180.

The voltage generator 180 is configured to bias the photo-detecting apparatus 100C. In this embodiment, the voltage generator 180 can be an operational amplifier in which one output is coupled to the gain boost circuit 190 and generates a bias voltage Vop1, and another output is coupled to switch 171B and generates a voltage VA2. Due to the drain of the switch 171B is in a negative feedback to an input of the operational amplifier, the voltage VA2 is substantially equal to the reference voltage Vref.

The gain boost circuit 190 includes transistors 144A and 145A, where the transistor 145A and the cascode transistor 130A collectively forma feedback circuit and accordingly increase a gain of the cascode transistor 130A. The voltage generator 180 generates the bias voltage Vop1 on the transistor 144A of the gain boost circuit 190 so as to adjust the control voltage VC1 and make the voltage VA1 being substantially equal to bias voltage VA2. Consequently, the voltages VA1 and VA2 are substantially equal to the reference voltage Vref.

This embodiment illustrates a one-tap photo-detecting apparatus 100C with an exemplary voltage generator 180. One may implement other voltage generator 180 to control the voltages VA1 and VA2 to reduce the dark-current generated by the optical-to-electric converter 170.

Figure 1D:
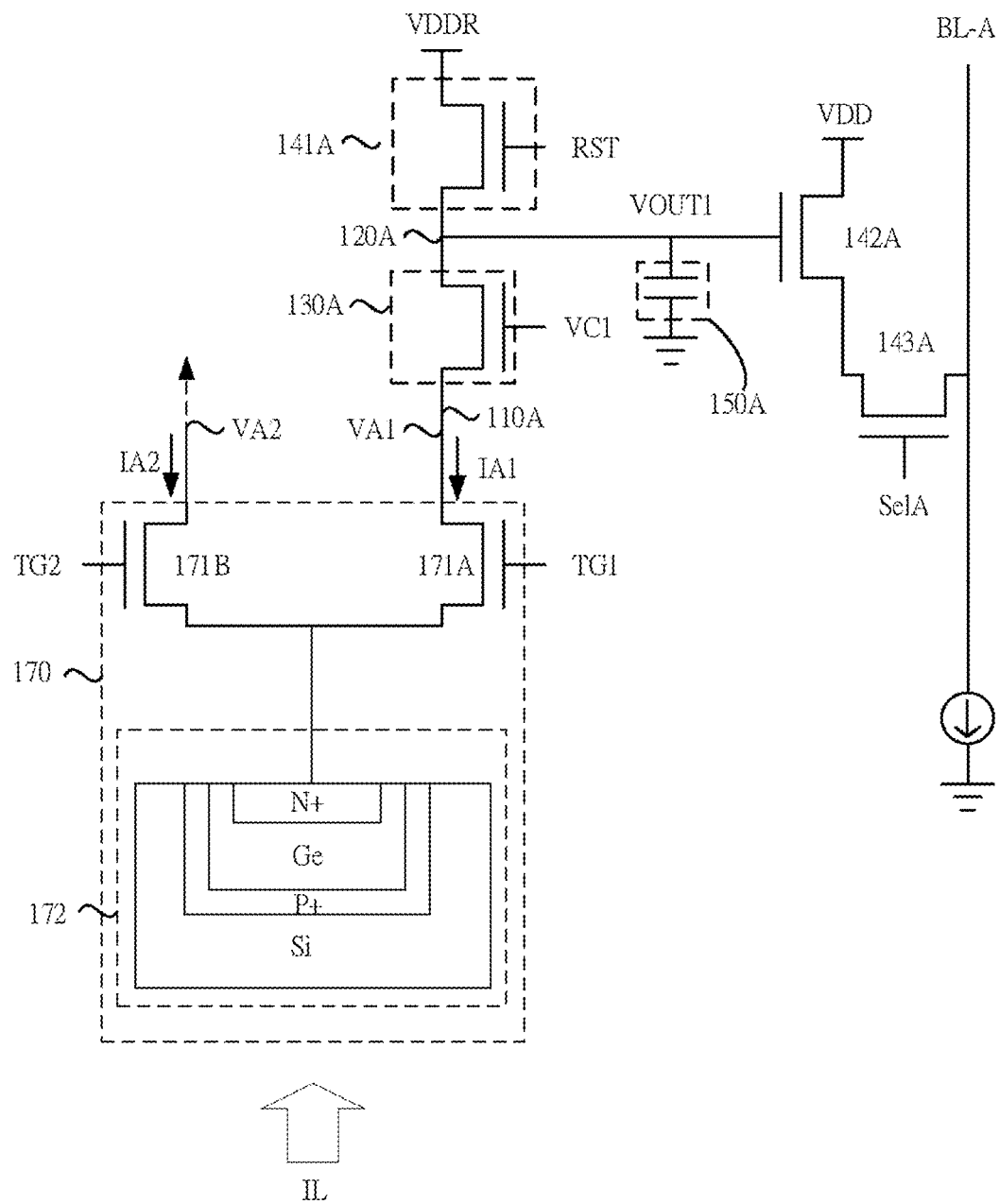

FIG. 1D illustrates a photo-detecting apparatus 100D with a cross-sectional view of a portion of the optical-to-electric converter 170. The photodiode 172, in this embodiment, is a vertical-type photodiode, where a N-doped region N+ and a P-doped region P+ are configured in a vertical direction, and a light-absorption material (e.g., germanium Ge or germanium-silicon GeSi) is formed in-between the N-doped region N+ and the P-doped region P+. In some implementations, the light-absorption material formed in-between the N-doped region N+ and the P-doped region P+ is supported by the semiconductor substrate (e.g., silicon Si or silicon-germanium SiGe). On the other hands, in one implementation, the switches 171A and 171B and the photodiode 172 can be manufactured in the same chip, the rest of the elements can be manufactured in another chip. In one implementation, the photodiode 172 can be manufactured in one chip, the rest of the elements can be manufactured in another chip. In one implementation, all the elements shown in FIG. 1D can be manufactured in the same chip. Furthermore, the optical-to-electric converter 170 can be implemented by back-side incident (BSI) or front-side incident (FSI), which means the light IL can be received from the bottom of the chip or top of the chip.

Figure 1E:
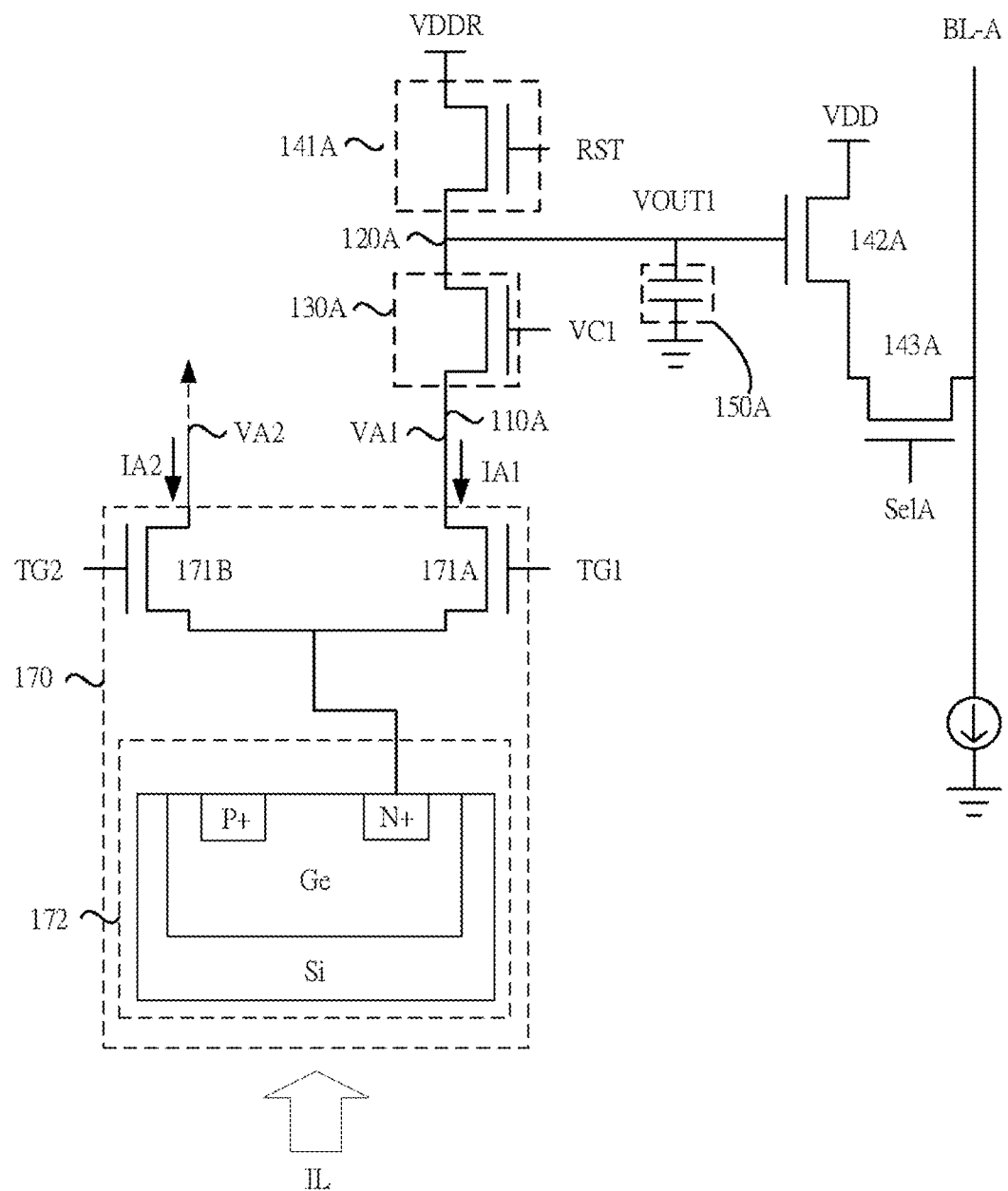

FIG. 1E illustrates a photo-detecting apparatus 100E with a cross-sectional view of a portion of the optical-to-electric converter 170. The photodiode 172, in this embodiment, is a horizontal-type photodiode, where a N-doped region N+ and a P-doped region P+ are configured in a horizontal direction, and a light-absorption material (e.g., germanium Ge or germanium-silicon GeSi) covers the N-doped region N+ and the P-doped region P+. In some implementations, the light-absorption material covers the N-doped region N+ and the P-doped region P+ at its surface, and is supported by the semiconductor substrate (e.g., silicon Si or silicon-germanium SiGe). On the other hands, in one implementation, the switches 171A and 171B and the photodiode 172 can be manufactured in the same chip, the rest of the elements can be manufactured in another chip. In one implementation, the photodiode 172 can be manufactured in one chip, the rest of the elements can be manufactured in another chip. In one implementation, all the elements shown in FIG. 1E can be manufactured in the same chip. Furthermore, the optical-to-electric converter 170 can be implemented by back-side incident (BSI) or front-side incident (FSI), which means the light IL can be received from the bottom of the chip or top of the chip.

Figures 1, 1F:
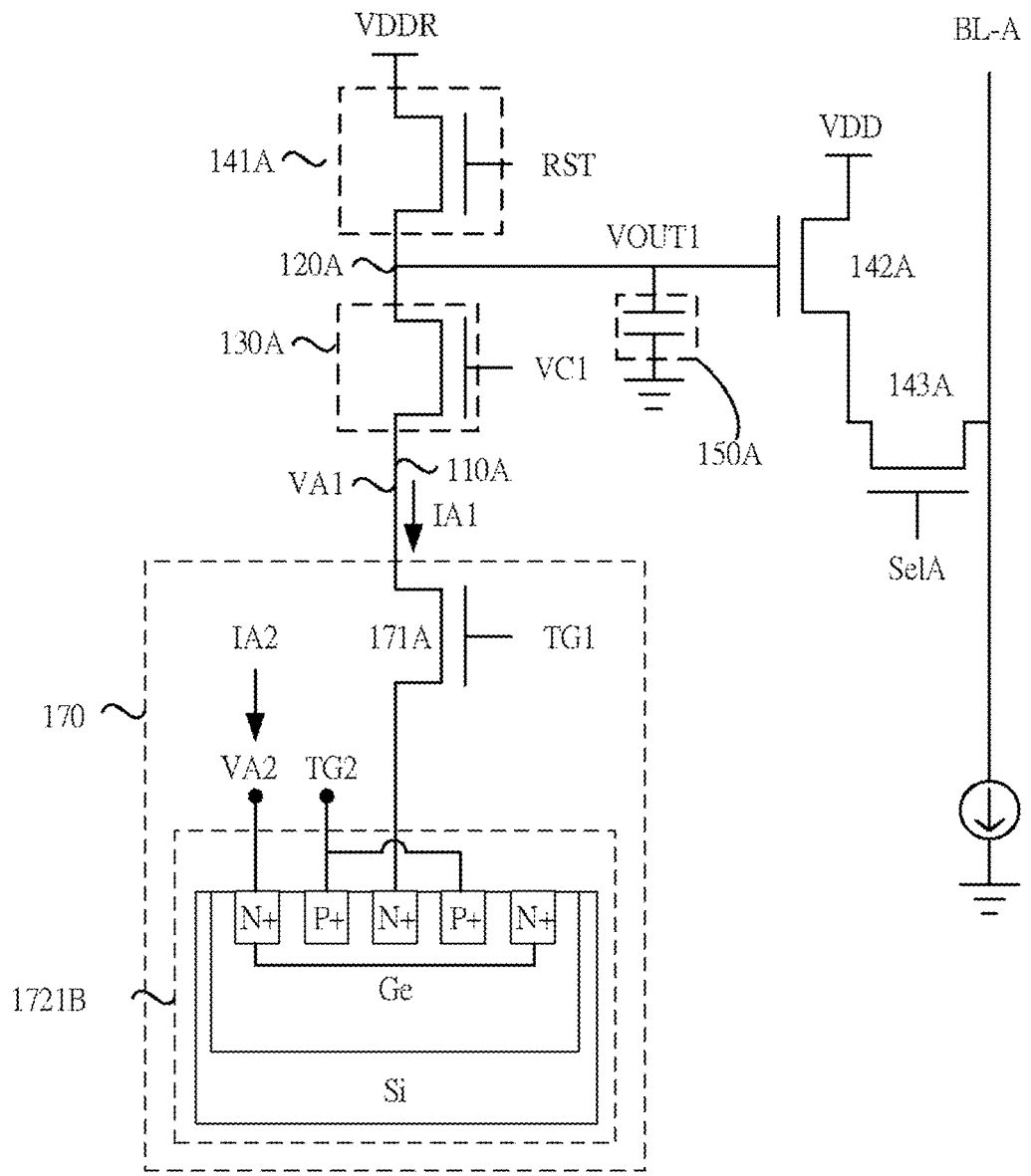

FIG. 1F-1 illustrates a photo-detecting apparatus 100F with a cross-sectional view of a portion of the optical-to-electric converter 170. The photodiode 172 and switch 171B can be integrated and laid out as shown in the block 1721B of FIG. 1F-1, where a light-absorption material (e.g., germanium Ge or germanium-silicon GeSi) covers these N-doped regions N+ and the P-doped regions P+. In some implementations, the light-absorption material covers the N-doped regions N+ and the P-doped regions P+ at its surface, and is supported by the semiconductor substrate (e.g., silicon Si or silicon-germanium SiGe). On the other hands, in one implementation, the switches 171A and 171B and the photodiode 172 can be manufactured in the same chip, the rest of the elements can be manufactured in another chip. In one implementation, the photodiode 172 can be manufactured in one chip, the rest of the elements can be manufactured in another chip. In one implementation, all the elements shown in FIG. 1F-1 can be manufactured in the same chip. Furthermore, the optical-to-electric converter 170 can be implemented by back-side incident (BSI) or front-side incident (FSI), which means the light IL can be received from the bottom of the chip or top of the chip.

Figures 1, 1F, 2:
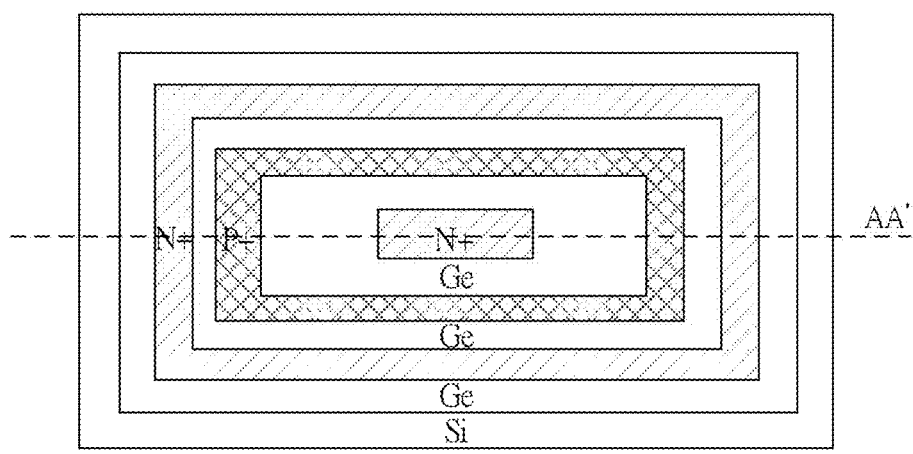

FIG. 1F-2 illustrates a top view of the layout of photodiode 172 and switch 171B embodied in photo-detecting apparatus 100F. This layout 1721B includes photodiode 172 and switch 171B. As illustrated in FIG. 1F-2, the profile of these doped regions is a ring and its cross-sectional view (line AA') corresponds to the layout 1721B of FIG. 1F-1.

Figure 1G:
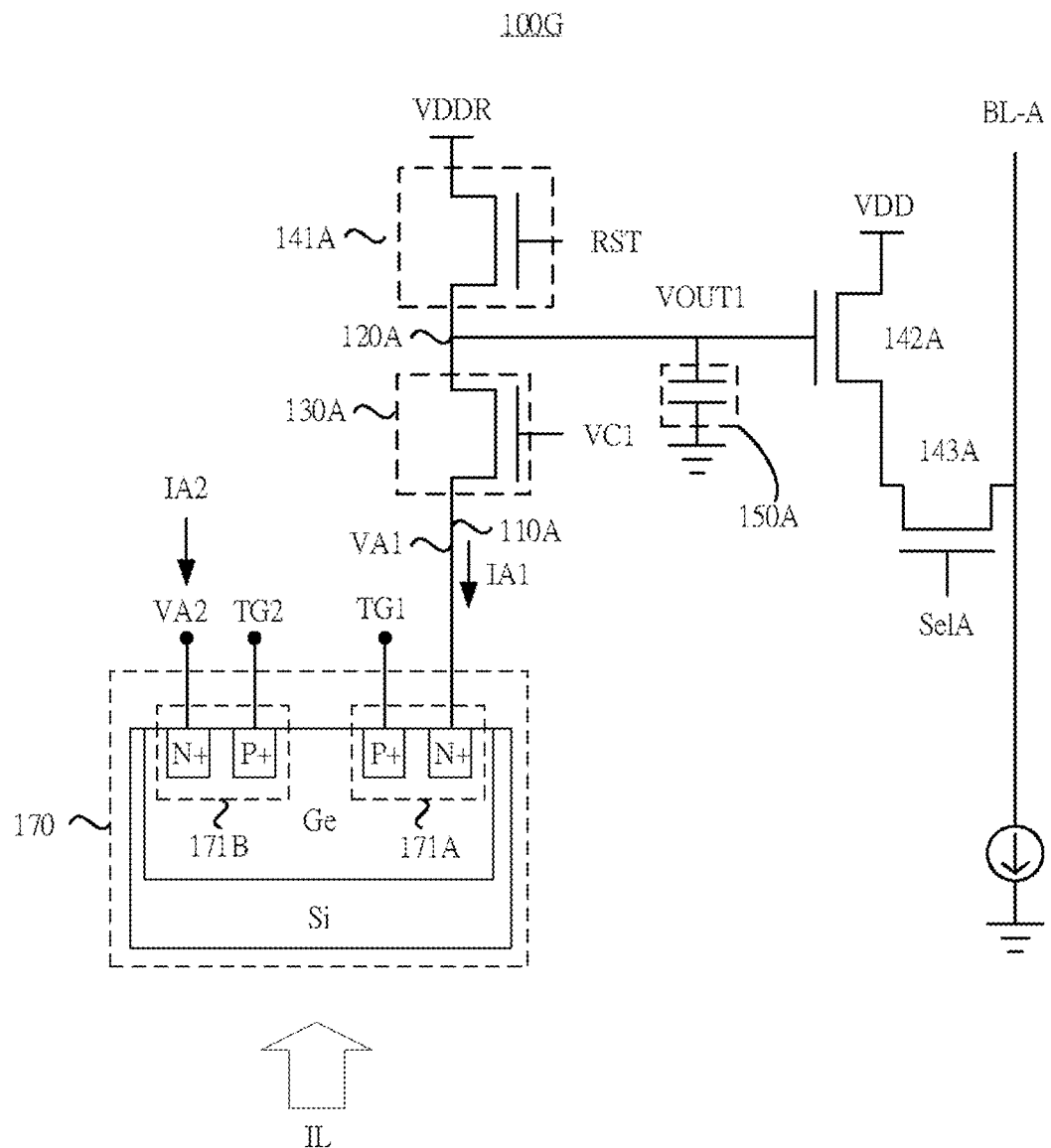

FIG. 1G illustrates a photo-detecting apparatus 100G with a cross-sectional view of the optical-to-electric converter 170. As illustrated in FIG. 1G, the optical-to-electric converter 170 includes switches 171A and 171B, and a light-absorption material (e.g., germanium Ge or germanium-silicon GeSi) is supported by the semiconductor substrate (e.g., silicon Si or silicon-germanium SiGe). The light-absorption material can use the material different from the semiconductor substrate. Each switch includes a terminal for receiving a demodulation signal and a terminal for outputting an electrical signal. For example, switch 171A includes a terminal for receiving the demodulation signal TG1 and a terminal for outputting the electrical signal IA1; and switch 171B includes a terminal for receiving the demodulation signal TG2 and a terminal for outputting the electrical signal IA2. In some implementations, the terminals for receiving the demodulation signal is highly-doped with P-type dopants; the terminals for outputting the electrical signal is highly-doped with N-type dopants.

Figure 1H:
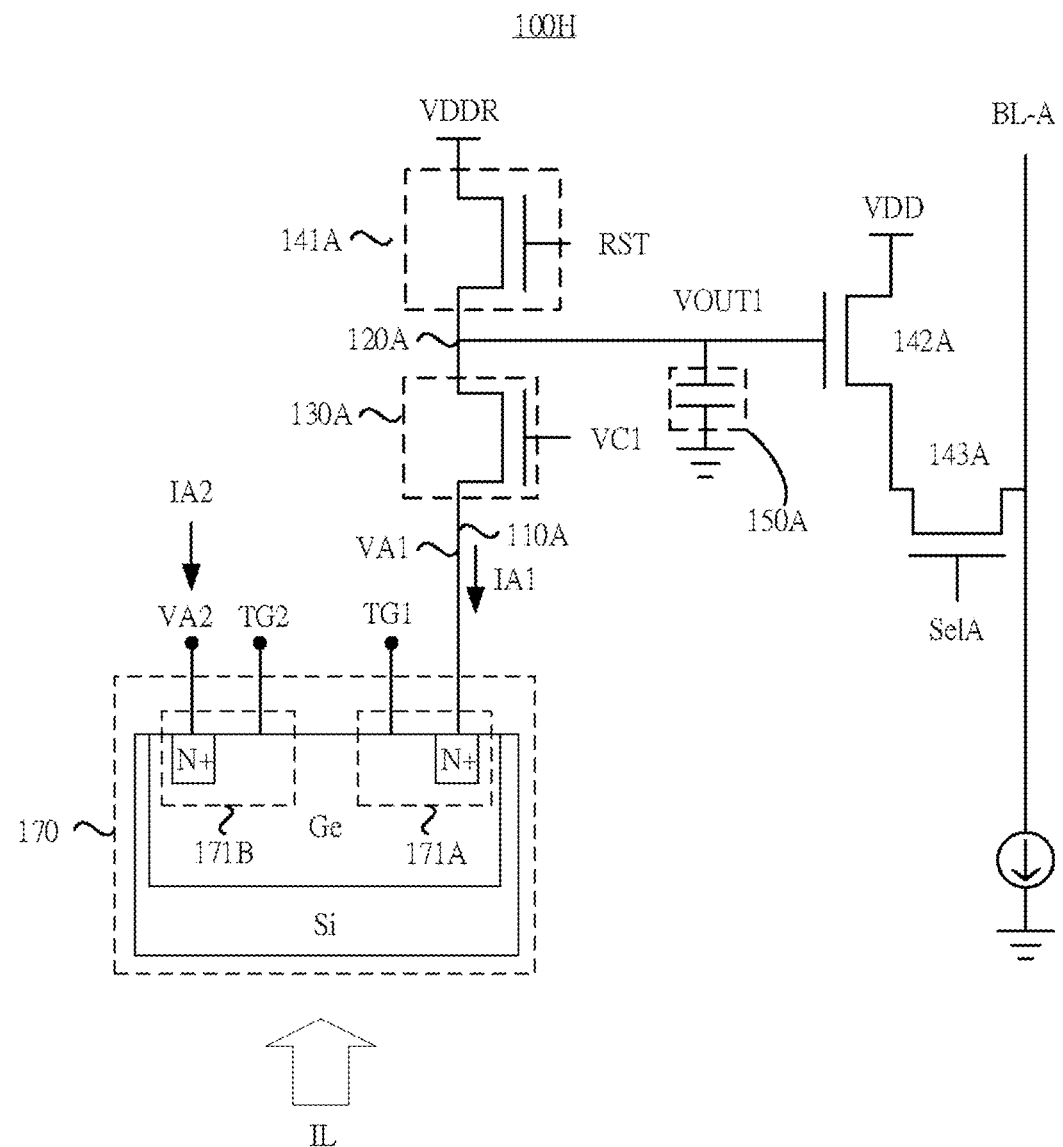

FIG. 1H illustrates a photo-detecting apparatus 100H with a cross-sectional view of the optical-to-electric converter 170. As illustrated in FIG. 1H, the optical-to-electric converter 170 includes switches 171A and 171B, and a light-absorption material (e.g., germanium Ge or germanium-silicon GeSi) is supported by the semiconductor substrate (e.g., silicon Si or silicon-germanium SiGe). The light-absorption material can use the material different from the semiconductor substrate. Each switch includes a terminal for receiving a demodulation signal and a terminal for outputting an electrical signal. For example, switch 171A includes a terminal for receiving the demodulation signal TG1 and a terminal for outputting the electrical signal IA1; and switch 171B includes a terminal for receiving the demodulation signal TG2 and a terminal for outputting the electrical signal IA2. Compared to FIG. 1G, the terminal of switch 171A for receiving the demodulation signal TG1 has no additional doping or is lightly-doped with P-type or N-type dopants, and the terminal of switch 171B for receiving the demodulation signal TG2 has no additional doping or is lightly-doped with P-type or N-type dopants.

One-Tap Optical Switch Application

Figures 1, 1I:
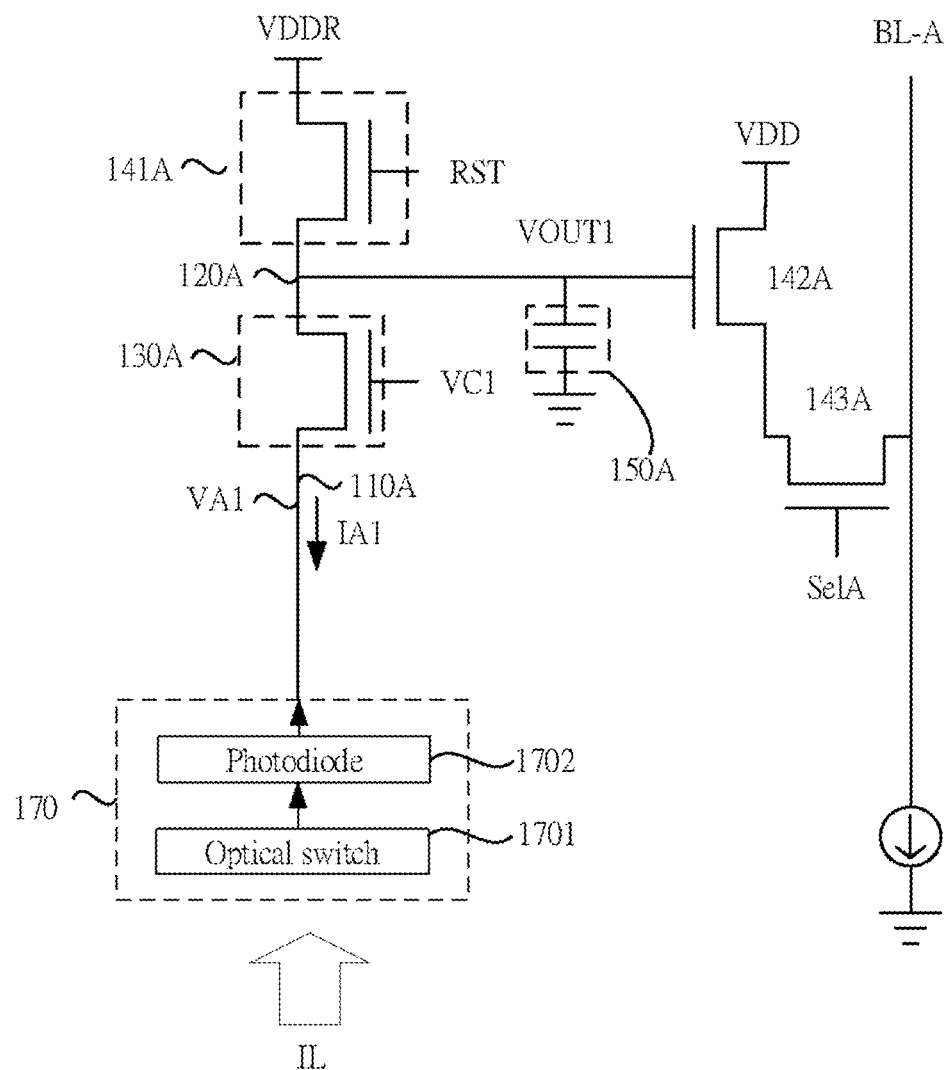
Figures 1, 1I, 2:
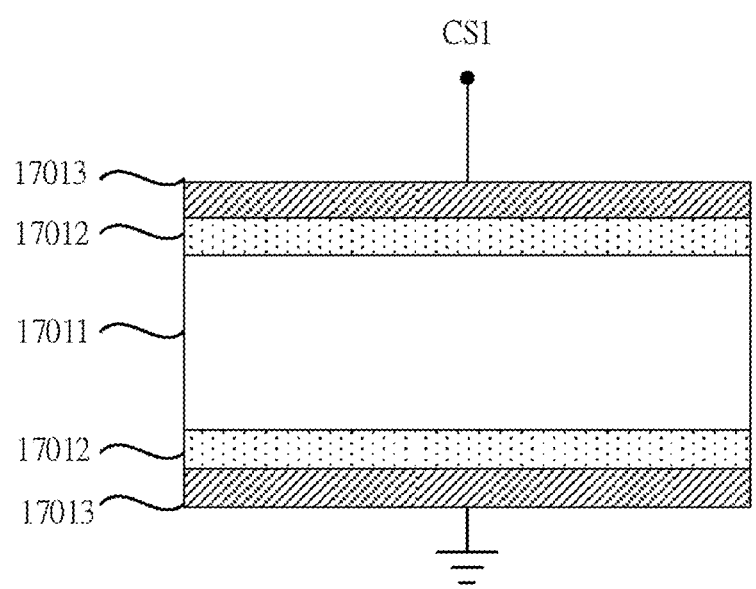

Optical switch may also be used in one-tap photo-detecting apparatus. FIG. 1I-1 illustrates a photo-detecting apparatus 100I with optical switch. As shown in FIG. 1I-1, optical-to-electric converter 170 includes an optical switch 1701 and a photodiode 1702. The optical switch 1701 is configured to gate or pass the incident light IL and the photodiode 1702 is configured to convert the light passed by the optional switch 1701 into the electrical signal IA1. The detail implementation will be described below.

FIG. 1I-2 illustrates an embodiment of optical switch 1701. Optical switch 1701 includes an electro-absorption material 17011, an optional transparent insulating material 17012 and a transparent conductive material 17013. The electro-absorption material 17011 is positioned in-between two transparent conductive materials 17013 with optional transparent insulating materials 17012. Optional transparent insulating material 17012 is an optional element, one may use or remove this material based on the design requirements. In some implementations, the electro-absorption material 17011 can be organic/inorganic semiconductor or quantum well/dot; the optional transparent insulating material 17012 can be oxide or polymer; and the transparent conductive materials 17013 can be fluorine/indium doped tin oxide. Furthermore, by properly patterning of the transparent conductive material 17013 it is possible to avoid excess capacitance and so to lower demodulating energy. During operation, transparent conductive materials 17013 will be biased by a control signal CS1 to control whether the incident light IL passes the optical switch 1701. For example, when the control signal CS1 is operated at a first bias, the incident light IL passes the optical switch 1701. Oppositely, when the control signal CS1 is operated at a second bias, the incident light IL may be absorbed by the electro-absorption material 17011 or being reflected so that the incident light IL cannot pass the optical switch 1701.

FIG. 1I-3 illustrates an embodiment of photodiode 1702. The photodiode 172, in this embodiment, is a vertical-type photodiode, where a first doped region 17015 and a second doped region 17016 are configured in a vertical direction, and a light-absorption material 170A1 (e.g., germanium Ge or silicon-germanium SiGe) is formed in-between the first doped region 17015 and the second doped region 17016. In some implementations, the light-absorption material 170A1 formed in-between the first doped region 17015 and the second doped region 17016, which is supported by the semiconductor substrate (e.g., silicon Si or silicon-germanium SiGe). The polarities of the first doped region 17015 and the second doped region 17016 are different. In one implementation, the first doped region 17015 is N-doped region and second doped region 17016 is P-doped region. In another implementation, the first doped region 17015 is P-doped region and second doped region 17016 is N-doped region.

FIG. 1I-4 illustrates an embodiment of photodiode 1702. The photodiode 172, in this embodiment, is a horizontal-type photodiode, where the first doped region 17015 and the second doped region 17016 are configured in a horizontal direction, and the light-absorption material 170A1 (e.g., germanium Ge or germanium-silicon GeSi) covers the first doped region 17015 and the second doped region 17016. In some implementations, the light-absorption material 170A1 is supported by the semiconductor substrate (e.g., silicon Si or silicon-germanium). The polarities of the first doped region 17015 and the second doped region 17016 are different. In one implementation, the first doped region 17015 is N-doped region and second doped region 17016 is P-doped region. In another implementation, the first doped region 17015 is P-doped region and second doped region 17016 is N-doped region.

FIG. 1I-5 illustrates an operation of the optical-to-electric converter 170 depicted in FIG. 1I-1 according to an embodiment. This operation includes the steps of receiving an incident light IL by a first optics (step S11), passing the incident light IL at a first bias, and absorbing or reflecting the incident light IL at a second bias by the optical switch 1701 (step S12), outputting the incident light IL passed by the optical switch 1701 by a second optics (step S13) and converting the passed incident light IL into the electrical signal IA1 by the photodiode 1702 (step S14). The first optics and second optics may include micro-lens, bandpass filter, partial mirror, grating, diffusor, etc. It is noted that the first optics and second optics are optional elements, and one may use or not use these optics depend on the design requirements.

One-Tap CIS Application

One-tap configuration can be used in CMOS image sensor (CIS), which is a two-dimensional (2D) sensing. As shown in FIG. 1J-1, similar to above-mentioned ToF architecture, a photo-detecting apparatus 100J used in CMOS image sensor includes an optical-to-electric converter 170, a cascode transistor 130A, a reset transistor 141A, a capacitor 150A, a source-follower transistor 142A, a row-select transistor 143A and a bit-line BL-A. In this embodiment, the optical-to-electric converter 170 includes a photodiode 172 and a switch 171A. The photodiode 172 is configured to convert an incident light IL to an electrical signal IA, which is a photo-current. The switch 171A is configured to output the electrical signal IA1 to the cascode transistor 130A according to a switch signal TG1, where the electrical signal IA will be generated when the switch signal TG1 turns-on the switch 171A.

At beginning, the reset signal RST resets the output voltage VOUT1 to the reset voltage VDDR. When the switch signal TG1 turns-on the switch 171A, the electrical signal IA1 is generated, the output voltage VOUT1 on the capacitor 150A will drop until the switch signal TG1 turns-off the transistor 171A. Compared to ToF application, the switch signal TG1 used in 2D sensing application turns-on the switch 171A for a longer time period (e.g., 100 μs, 500 μs, 1 ms, 5 ms, or similar time scales) to absorb the incident light IL, instead of using a fast demodulation signal (e.g., 3 ns, 10 ns, 30 ns, 100 ns or similar time scales).

The cascode transistor 130A is configured as a buffer, which is coupled between the optical-to-electric converter 170 and the reset transistor 141A. Specifically, the channel terminal (e.g., drain terminal) of the cascode transistor 130A is coupled to the channel terminal (e.g., source terminal) of the reset transistor 141A, and the channel terminal (e.g., source terminal) of the cascode transistor 130A is coupled to channel terminal (e.g., drain terminal) of the transistor (171A). The control terminal (e.g., gate terminal) of the cascode transistor 130A is coupled to a control voltage VC1. In some implementations, switch 171A, cascode transistor 130A, reset transistor 141A, source-follower transistor 142A and row-select transistor 143A can be implemented by NMOS transistors or PMOS transistors.

Since the cascode transistor 130A is coupled between the output terminal 110A of the optical-to-electric converter 170 and the channel terminal (e.g., source terminal) of the reset transistor 141A, the output terminal 110A of the optical-to-electric converter 170 and the channel terminal (e.g., source terminal) of the reset transistor 141A are separated when the cascode 130A transistor is operated in the saturation or the subthreshold region. The voltage VA1 generated on the output terminal 110A of the optical-to-electric converter 170 can be controlled or biased at a constant voltage VA1 to reduce the dark current generated by the optical-to-electric converter 170.

In one implementation, the control terminal (e.g., gate terminal) of the cascode transistor 130A and the control terminal (e.g. gate terminal) of the transistor 171A can be coupled to each other, meaning the control voltage VC1 and the switch signal TG1 are the same, which is a signal for switching on/off the cascode transistor 130A and transistor 171A.

In one implementation, the control terminal (e.g., gate terminal) of the cascode transistor 130A and the control terminal (e.g., gate terminal) of the transistor 171A can be separated, meaning the control voltage VC1 and the switch signal TG1 are different, in which the control voltage VC1 is a constant voltage and the switch signal TG1 is a signal for switching on/off the transistor 171A.

The source-follower transistor 142A and the row-select transistor 143A are configured to read out the output voltage VOUT1 to the bit-line BL-A according to the selecting signal SelA.

FIG. 1J-2 illustrates the photo-detecting apparatus 100J with a structural view of the photodiode 172. The photodiode 172, in this embodiment, is a vertical-type photodiode, where a N-doped region N+ and a P-doped region P+ are configured in a vertical direction, and a light-absorption material (e.g., germanium Ge or germanium-silicon GeSi) is formed in-between the N-doped region N+ and the P-doped region P+. In some implementations, the light-absorption material formed in-between the N-doped region N+ and the P-doped region P+ is supported by the semiconductor substrate (e.g., silicon Si or SiGe silicon-germanium). On the other hands, in one implementation, the switch 171A and the photodiode 172 can be manufactured in the same chip, the rest of the elements can be manufactured in another chip. In one implementation, the photodiode 172 can be manufactured in one chip, the rest of the elements can be manufactured in another chip. In one implementation, all the elements shown in FIG. 1J-2 can be manufactured in the same chip. Furthermore, the optical-to-electric converter 170 can be implemented by back-side incident (BSI) or front-side incident (FSI), which means the light IL can be received from the bottom of the chip or top of the chip.

FIG. 1J-3 illustrates the photo-detecting apparatus 100J with a structural view of the photodiode 172. The photodiode 172, in this embodiment, is a horizontal-type photodiode, where a N-doped region N+ and a P-doped region P+ are configured in a horizontal direction, and a light-absorption material (e.g., germanium Ge or germanium-silicon GeSi) covers the N-doped region N+ and the P-doped region P+. In some implementations, the light-absorption material covers the N-doped region N+ and the P-doped region P+ at its surface, and is supported by the semiconductor substrate (e.g., silicon Si or silicon-germanium). On the other hands, in one implementation, the switch 171A and the photodiode 172 can be manufactured in the same chip, the rest of the elements can be manufactured in another chip. In one implementation, the photodiode 172 can be manufactured in one chip, the rest of the elements can be manufactured in another chip. In one implementation, all the elements shown in FIG. 1J-3 can be manufactured in the same chip. Furthermore, the optical-to-electric converter 170 can be implemented by back-side incident (BSI) or front-side incident (FSI), which means the light IL can be received from the bottom of the chip or top of the chip.

FIG. 1J-4 illustrates the photo-detecting apparatus 100J with a structural view of the photodiode 172. The photodiode 172, in this embodiment, is a horizontal-type photodiode, where a N-doped region N+ and a P-doped region P+ are configured in a horizontal direction. Compared to FIG. 1J-3, this embodiment uses silicon semiconductor substrate as a light-absorption material. On the other hands, in one implementation, the switch 171A and the photodiode 172 can be manufactured in the same chip, the rest of the elements can be manufactured in another chip. In one implementation, the photodiode 172 can be manufactured in one chip, the rest of the elements can be manufactured in another chip. In one implementation, all the elements shown in FIG. 1J-4 can be manufactured in the same chip. Furthermore, the optical-to-electric converter 170 can be implemented by back-side incident (BSI) or front-side incident (FSI), which means the light IL can be received from the bottom of the chip or top of the chip.

FIG. 1A to FIG. 1J-4 illustrate the photo-detecting apparatuses with one-tap configuration, which can be used in 3D sensing application (e.g., ToF applications) or 2D sensing application (e.g., CIS applications). 3D sensing application uses demodulation signal to obtain the image depth information. However, 2D sensing application uses non-demodulation signal to obtain the image intensity information. Furthermore, two-tap configuration is also an alternative embodiment for performing photo-detecting function, and the relevant details will be described below.

General Structure of Two-Tap Configuration

Figure 2A:
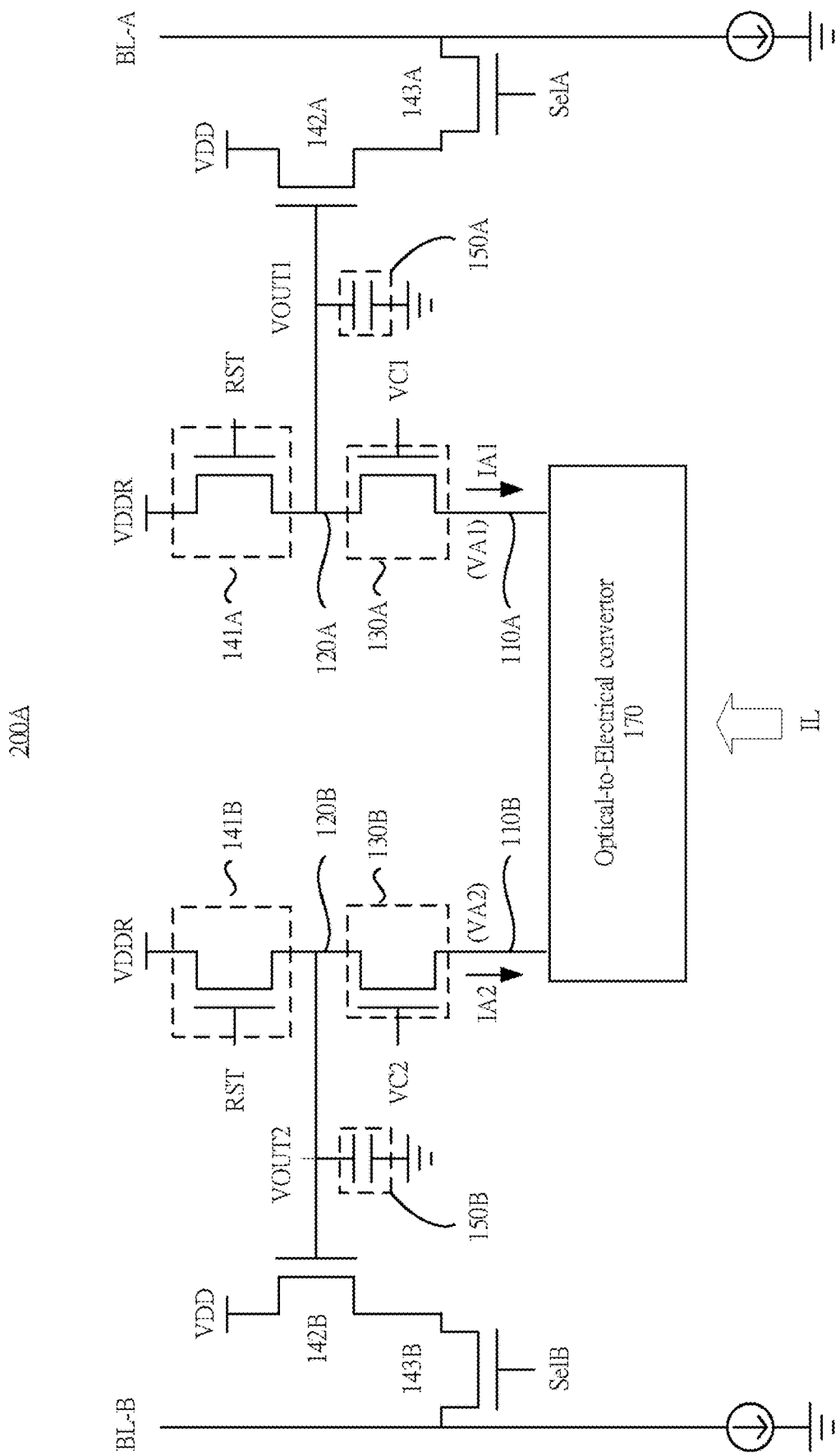

FIG. 2A illustrates a photo-detecting apparatus 200A with two-tap configuration, according to some embodiments. The photo-detecting apparatus 200A includes an optical-to-electric converter 170, cascode transistors 130A and 130B, reset transistors 141A and 141B, source-follower transistors 142A and 142B, row-select transistors 143A and 143B, capacitors 150A and 150B, and bit-lines BL-A and BL-B. Compared to FIG. 1A, the photo-detecting apparatus 100A with one-tap configuration is an unsymmetrical structure, however, the photo-detecting apparatus 200A with two-tap configuration is a symmetrical structure.

The optical-to-electric converter 170 is configured to convert an incident light IL to an electrical signal IA1 at an output terminal 110A and an electrical signal IA2 at an output terminal 110B, where the electrical signal IA1 and the electrical signal IA2 are photo-currents. There are many implementations for the optical-to-electric converter 170, the details will be described hereinafter. The cascode transistor 130A is coupled between the optical-to-electric converter 170 and the reset transistor 141A. Specifically, one channel terminal (e.g., source terminal) of the cascode transistor 130A is coupled to the output terminal 110A of the optical-to-electric converter 170 and the other channel terminal (e.g., drain terminal) of cascode transistor 130A is coupled to one channel terminal (e.g., source terminal) of the reset transistor 141A. Similarly, the cascode transistor 130B is coupled between the optical-to-electric converter 170 and the reset transistor 141B. Specifically, one channel terminal (e.g., source terminal) of the cascode transistor 130B is coupled to the output terminal 110B of the optical-to-electric converter 170 and the other channel terminal (e.g., drain terminal) of cascode transistor 130B is coupled to one channel terminal (e.g., source terminal) of the reset transistor 141B. In some implementations, cascode transistors 130A and 130B, reset transistors 141A and 141B, source-follower transistors 142A and 142B, and row-select transistors 143A and 143B can be implemented by NMOS transistors or PMOS transistors.

During operation of the photo-detecting apparatus 100B, the channel terminal 120A on the capacitor 150A is charged to a reset voltage VDDR through the reset transistor 141A. For example, by applying a reset signal RST that causes the reset transistor 141A to operate in the saturation or triode region, a current will flow through the reset transistor 141A onto the capacitor 150A and charge the capacitor 150A to the reset voltage VDDR. Similarly, the channel terminal 120B on the capacitor 150B is charged to the reset voltage VDDR through the reset transistor 141B. For example, by applying the reset signal RST that causes the reset transistor 141B to operate in the saturation or triode region, a current will flow through the reset transistor 141B onto the capacitor 150B and charge the capacitor 150B to the reset voltage VDDR. It is noted that the reset voltage VDDR can be the same or different with the supply voltage VDD.

Once the charging is completed, an integration of the electrical signals IA1 and IA2 generated by the optical-to-electric converter 170 may begin. The cascode transistor 130A can be controlled to initiate and terminate the integration through a control voltage Vc1 generated on the gate terminals of the cascode transistor 130. For example, the control voltage Vc1 may be set to operate the cascode transistor 130 in the subthreshold or saturation region so that the voltage VA1 generated at terminal 110A can be maintained at a nearly constant bias. Similarly, the cascode transistor 130B can be controlled to initiate and terminate the integration through a control voltage Vc2 generated on the gate terminals of the cascode transistor 130B. For example, the control voltage Vc2 may be set to operate the cascode transistor 130B in the subthreshold or saturation region so that the voltage VA2 generated at terminal 110B can be maintained at a nearly constant bias. As the voltages VA1 and VA2 generated at terminal 110A and terminal 110B are stable and relatively low, the dark current generated by the optical-to-electric converter 170 can be suppressed.

Two-Tap ToF Application

Figure 2B:
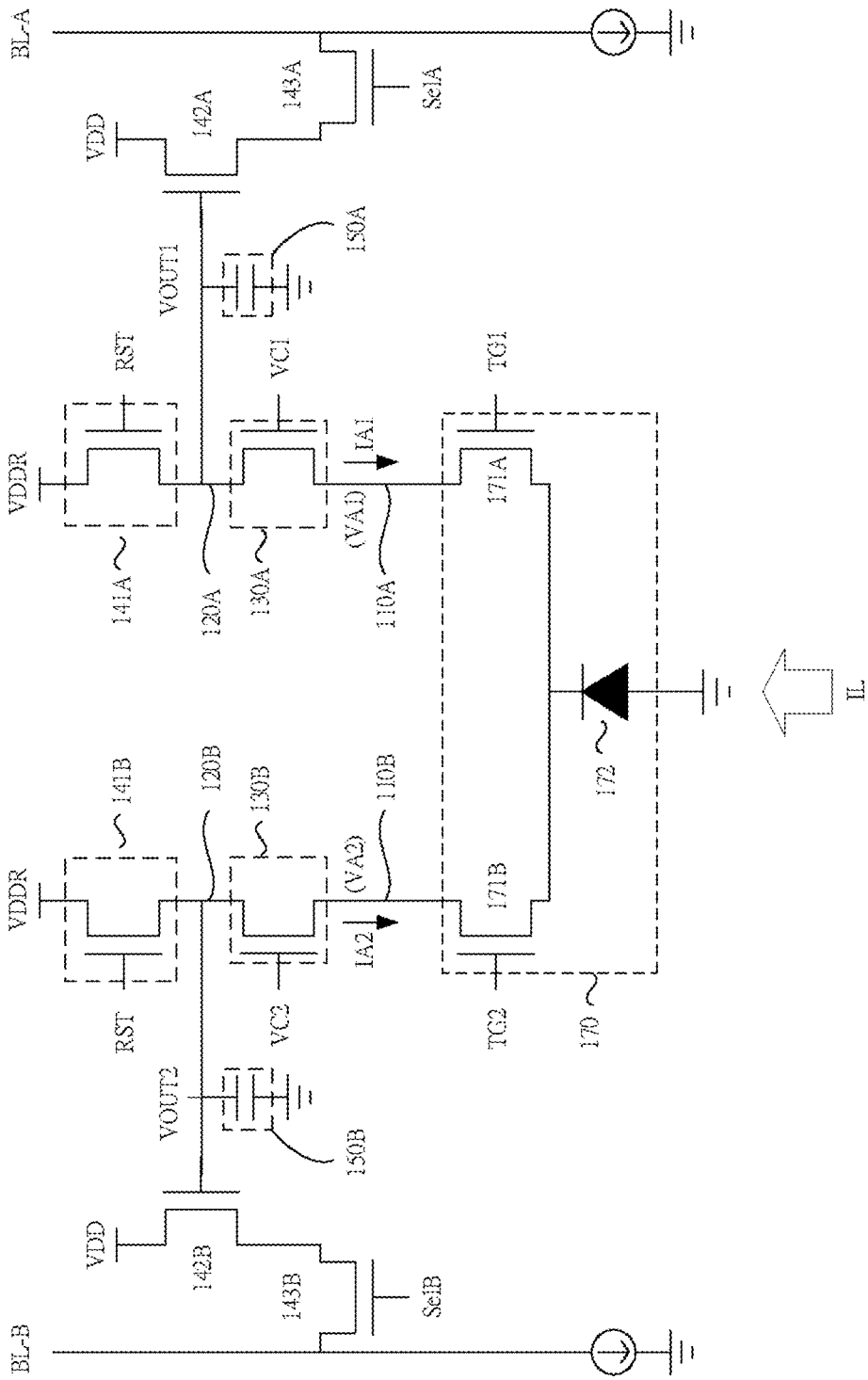

FIG. 2B illustrates a photo-detecting apparatus 200B with two-tap configuration, which is used in ToF application. Specifically, this embodiment shows a configuration of the optical-to-electric converter 170, including a photodiode 172, switches 171A and 171B.

In accordance with this embodiment, applying a switch signal TG1 greater than the threshold voltage of the switch 171A while applying a switch signal TG2 lower than the threshold voltage of switch 171B, the photo-generated carriers generated by the photodiode 172 will be directed to flow through the cascode transistor 130A. Contrarily, applying a switch signal TG2 greater than the threshold voltage of the switch 171B while applying a switch signal TG1 lower than the threshold voltage of switch 171A, the photo-generated carriers generated by the photodiode 110 will be directed to flow through the cascode transistor 130B.

In more detail, the switch signal TG1 and the switch signal TG2 are demodulation signals. In one implementation, the switch signal TG1 and the switch signal TG2 are differential to each other. In another implementation, the switch signal TG1 and the switch signal TG2 use clock signals with a 50% duty cycle. In other possible implementations, the duty cycle can be different (e.g., 30% duty cycle). In some implementations, square wave is used as the modulation and demodulation signals. In some implementations, sinusoidal wave is used as the modulation and demodulation signals instead of square wave.

During integration operation, the capacitor 150A will be discharged when the switch signal TG1 turns-on the switch 171A and the incident light IL comes in. Similarly, the capacitor 150B will be discharged when the switch signal TG2 turns-on the switch 171B and the incident light IL comes in. Thus, the photo-current IA1 and the photo-current IA2 are generated in-turn during integration operation. After a predetermined time of integration, the output voltage VOUT1 will be dropped to a settled value and the output voltage VOUT2 will be dropped to another settled value. According to a selecting signals SelA and SelB, the settled value of the output voltage VOUT1 will be read-out onto the bit-line BL-A through the source-follower transistor 142A and row-select transistor 143A, and the settled value of the output voltage VOUT2 will be read-out onto the bit-line BL-B through the source-follower transistor 142B and row-select transistor 143B. By repeating the above procedure but with different modulation and/or demodulation phases the system can determine a distance between a target object and the photo-detecting apparatus 200B.

There are many implementations for optical-to-electric converter 170 of photo-detecting apparatus 200B. For example, the optical-to-electric converter 170 of photo-detecting apparatus 200B can use the embodiments of optical-to-electric converter 170 illustrated in FIG. 1D to FIG. 1H. One may use other embodiments to implement optical-to-electric converter 170 as well.

Two-Tap Optical Router Application

Figure 2C:
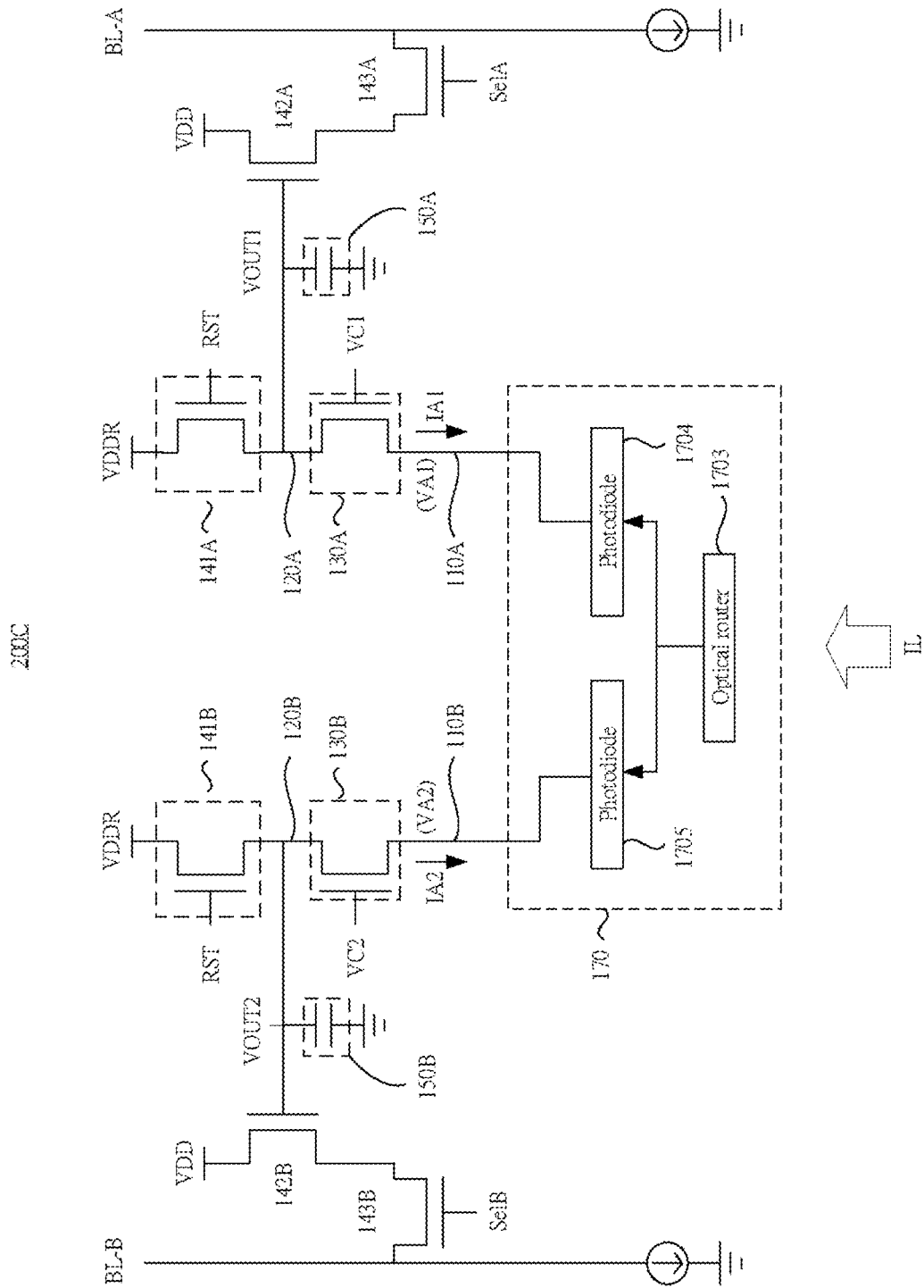

FIG. 2C illustrates a photo-detecting apparatus 200C with optical router. As shown in FIG. 2C, optical-to-electric converter 170 includes an optical router 1703 and photodiodes 1704 and 1705. The optical router 1703 is configured to direct the incident light IL to the photodiode 1704 or the photodiode 1705 so that the photodiode 1704 and photodiode 1705 convert the incident light IL into the electrical signals IA1 and IA2 respectively.

The optical router 1703 of the photo-detecting apparatus 200C can be implemented by utilizing liquid crystals, pn/pin junctions, MEMS (micro-electrical-mechanical-system) capacitors, thermal heating pads, nonlinear crystals with $2^{nd}$ or $3^{rd}$ order of nonlinearity or other active means to direct the incident light IL through a free-space or a dielectric-space or a PIC (photonic integrated circuit) to the photodiode 1704 or the photodiode 1705.

Two-Tap CIS Application

Figures 1, 2D:
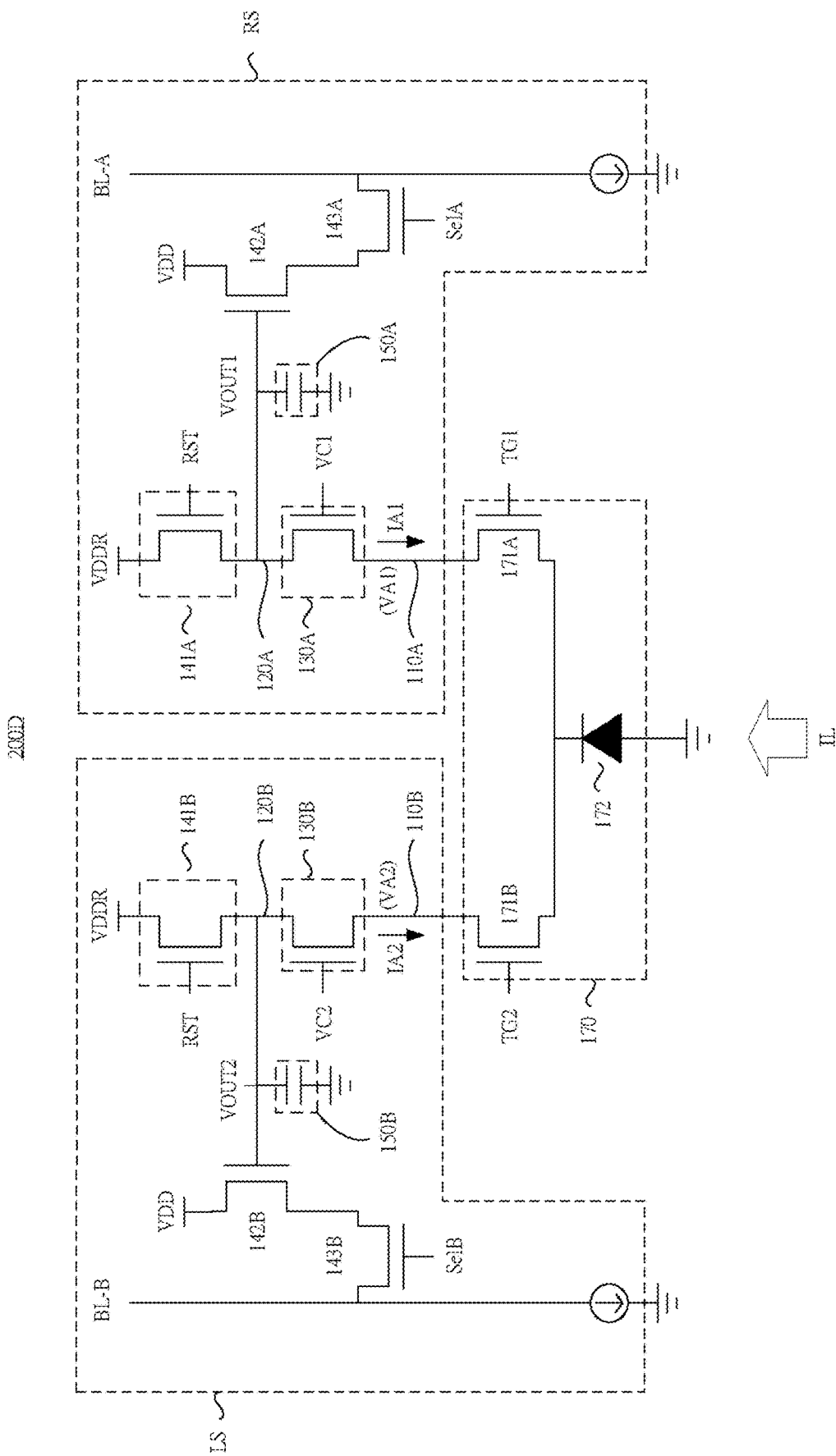
Figures 2, 2D:
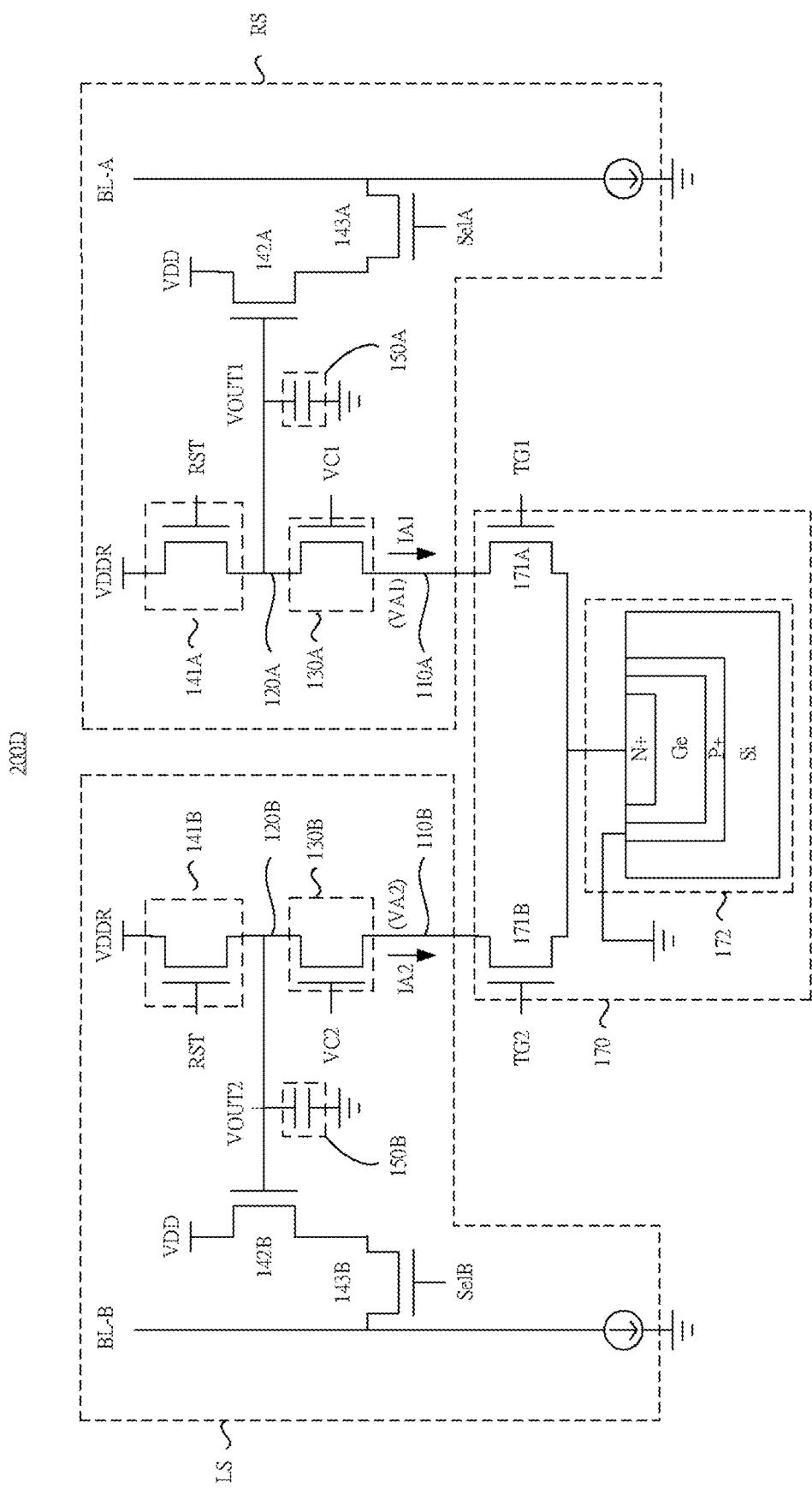
Figures 2, 2D, 3:
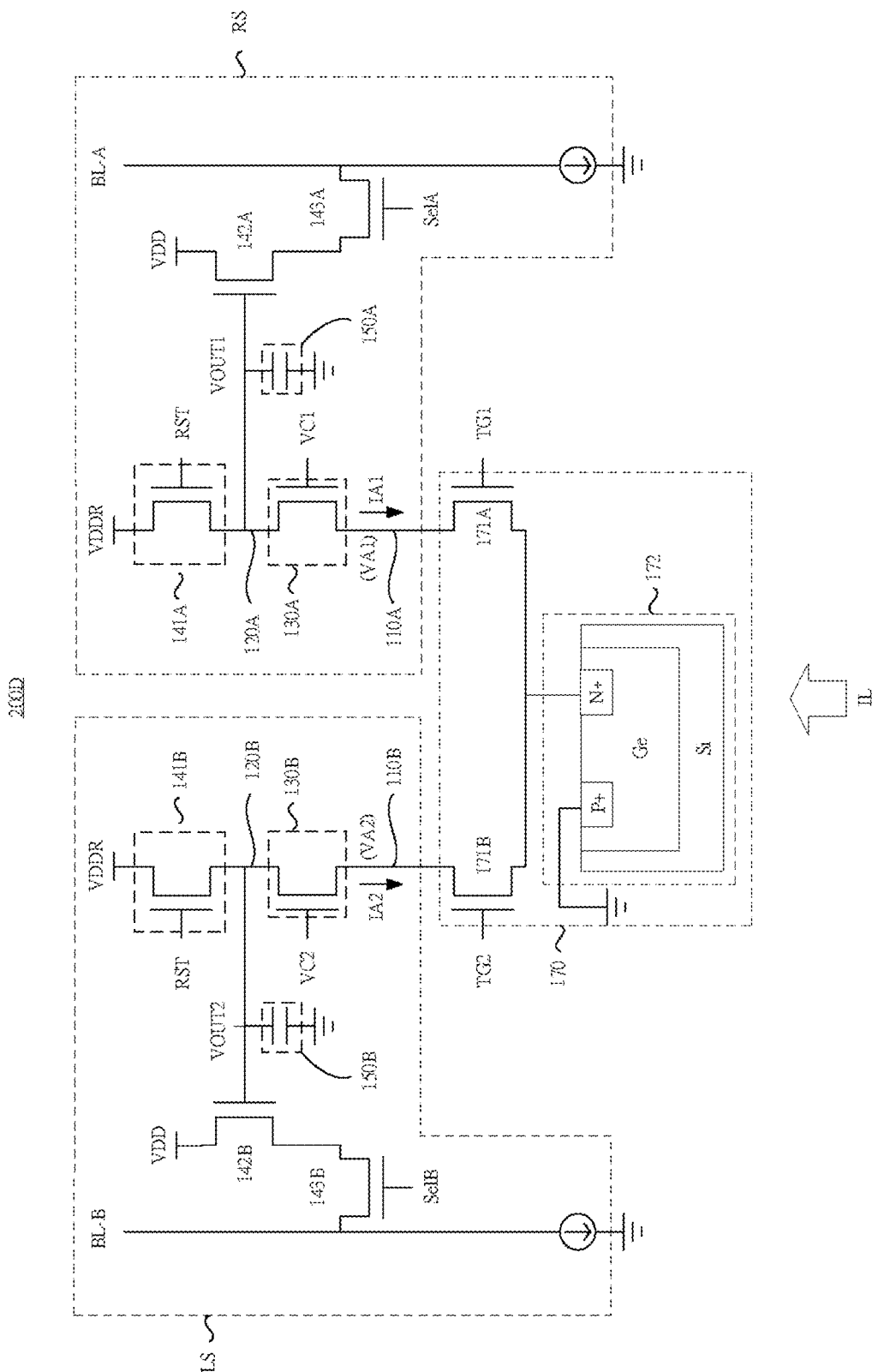
Figures 2, 2D, 3, 4:
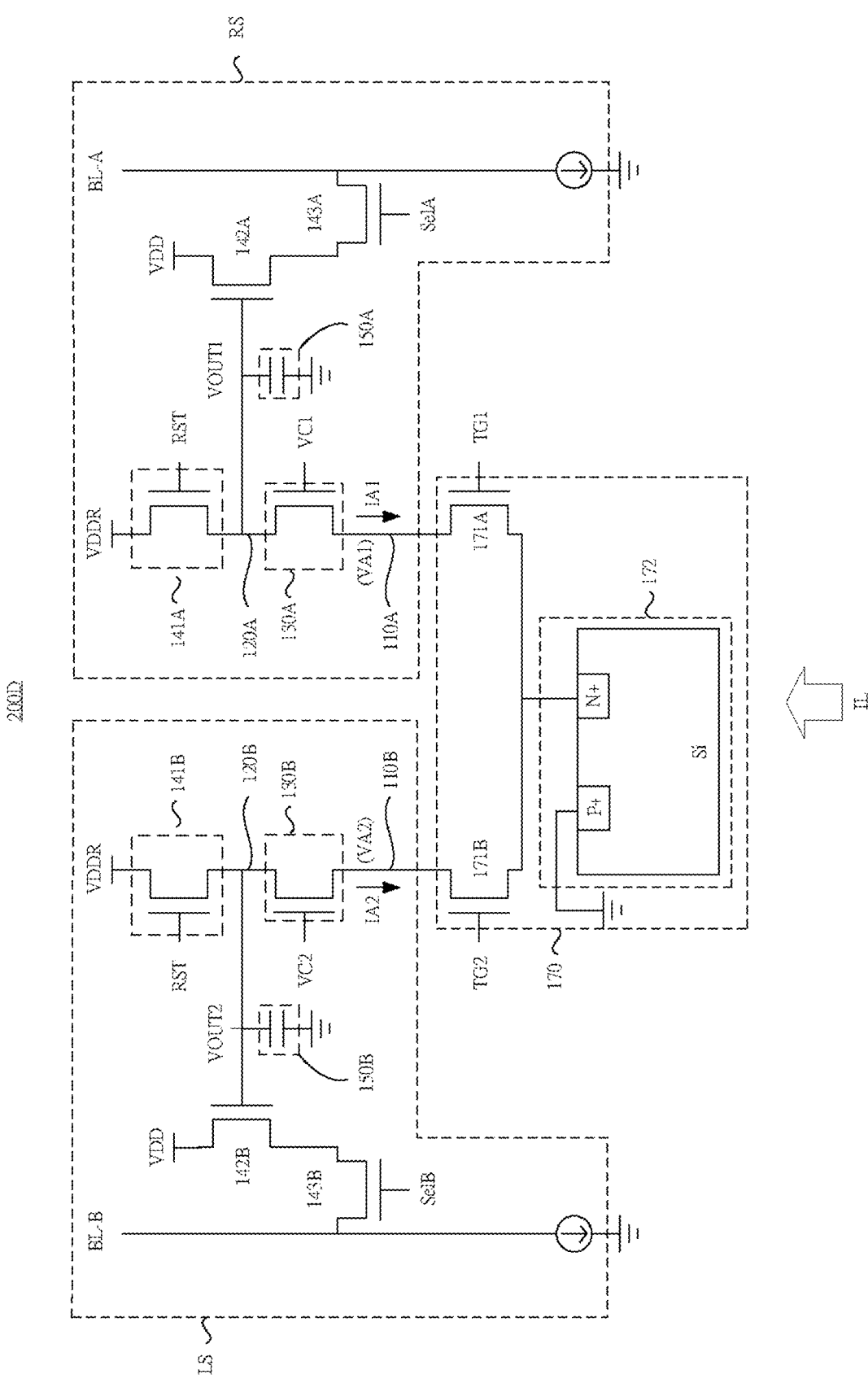

Two-tap configuration can be used in CMOS image sensor (CIS), which is a two-dimensional (2D) sensing. As shown in FIG. 2D-1, a photo-detecting apparatus 200D used in CMOS image sensor includes an optical-to-electric converter 170, cascode transistors 130A and 130B, reset transistors 141A and 141B, source-follower transistors 142A and 142B, row-select transistors 143A and 143B, capacitors 150A and 150B, and bit-lines BL-A and BL-B.

Compared to the photo-detecting apparatus 200B of FIG. 2B, the structure of photo-detecting apparatus 200D and the structure of photo-detecting apparatus 200B are the same. However, their operations are different.

At beginning, the reset signal RST resets the output voltage VOUT1 to the reset voltage VDDR and the output voltage VOUT2 to the reset voltage VDDR. When the switch signal TG1 turns-on the switch 171A, the electrical signal IA1 is generated, the output voltage VOUT1 on the capacitor 150A will drop until the switch signal TG1 turns-off the transistor (171A). Similarly, when the switch signal TG2 turns-on the switch 171B, the electrical signal IA2 is generated, the output voltage VOUT2 on the capacitor 1502 will drop until the switch signal TG2 turns-off the transistor (171B).

Compared to ToF application, the switch signals TG1 and TG2 used in 2D sensing application can turns-on the switches 171A and 171B simultaneously for a longer time period (e.g., 100 µs, 500 µs, 1 ms, 5 ms, or similar time scales) to absorb the incident light IL, instead of using demodulation signal. In other words, the right-hand side circuit RS and left-hand side circuit LS can be symmetrically operated. In other implementation, the right-hand side circuit RS and left-hand side circuit LS can be independently operated. The photo-detecting apparatus 200D can turns-on either switch 171A or switch 171B for a longer time period (e.g., 100 µs, 500 µs, 1 ms, 5 ms, or similar time scales), instead of using demodulation signal, to absorb the incident light IL to perform 2D sensing. In other words, one of the right-hand side circuit RS and left-hand side circuit LS is disable.

The cascode transistors 130A is configured as a buffer, which is coupled between the optical-to-electric converter 170 and the reset transistor 141A. Specifically, the channel terminal (e.g., drain terminal) of the cascode transistor 130A is coupled to the channel terminal (e.g., source terminal) of the reset transistor 141A, and the channel terminal (e.g., source terminal) of the cascode transistor 130A is coupled to channel terminal (e.g., drain terminal) of the transistor 171A. The control terminal (e.g., gate terminal) of the cascode transistor 130A is coupled to a control voltage VC1. In some implementations, switch 171A, cascode transistor 130A, reset transistor 141A, source-follower transistor 142A and row-select transistor 143A can be implemented by NMOS transistors or PMOS transistors.

Similarly, the cascode transistors 130B is configured as a buffer, which is coupled between the optical-to-electric converter 170 and the reset transistor 141B. Specifically, the channel terminal (e.g., drain terminal) of the cascode transistor 130B is coupled to the channel terminal (e.g., source terminal) of the reset transistor 141B, and the channel terminal (e.g., source terminal) of the cascode transistor 130B is coupled to channel terminal (e.g., drain terminal) of the transistor 171B. The control terminal (e.g., gate terminal) of the cascode transistor 130A is coupled to a control voltage VC2. In some implementations, switch 171B, cascode transistor 130B, reset transistor 141B, source-follower transistor 142B and row-select transistor 143B can be implemented by NMOS transistors or PMOS transistors.

Since the cascode transistor 130A is coupled between the output terminal 110A of the optical-to-electric converter 170 and the channel terminal (e.g., source terminal) of the reset transistor 141A, the output terminal 110A of the optical-to-electric converter 170 and the channel terminal (e.g., source terminal) of the reset transistor 141A are separated when the cascode 130A transistor is operated in the saturation or the subthreshold region. The voltage VA1 generated on the output terminal 110A of the optical-to-electric converter 170 can be controlled or biased at a constant voltage VA1 to reduce the dark current generated by the optical-to-electric converter 170.

Similarly, since the cascode transistor 130B is coupled between the output terminal 110B of the optical-to-electric converter 170 and the channel terminal (e.g., source terminal) of the reset transistor 141B, the output terminal 110B of the optical-to-electric converter 170 and the channel terminal (e.g., source terminal) of the reset transistor 141A are separated when the cascode 130B transistor is operated in the saturation or the subthreshold region. The voltage VA2 generated on the output terminal 110B of the optical-to-electric converter 170 can be controlled or biased at a constant voltage VA2 to reduce the dark current generated by the optical-to-electric converter 170.

In one implementation, the control terminal (e.g., gate terminal) of the cascode transistor 130A and the control terminal (e.g. gate terminal) of the transistor 171A can be coupled to each other, meaning the control voltage VC1 and the switch signal TG1 are the same, which is a signal for switching on/off the cascode transistor 130A and transistor 171A.

Similarly, in one implementation, the control terminal (e.g., gate terminal) of the cascode transistor 130B and the control terminal (e.g. gate terminal) of the transistor 171B can be coupled to each other, meaning the control voltage VC2 and the switch signal TG2 are the same, which is a signal for switching on/off the cascode transistor 130A and transistor 171A.

In one implementation, the control terminal (e.g., gate terminal) of the cascode transistor 130A and the control terminal (e.g., gate terminal) of the transistor 171A can be separated, meaning the control voltage VC1 and the switch signal TG1 are different, in which the control voltage VC1 is a constant voltage and the switch signal TG1 is a signal for switching on/off the transistor 171A.

Similarly, in one implementation, the control terminal (e.g., gate terminal) of the cascode transistor 130B and the control terminal (e.g., gate terminal) of the transistor 171B can be separated, meaning the control voltage VC2 and the switch signal TG2 are different, in which the control voltage VC2 is a constant voltage and the switch signal TG2 is a signal for switching on/off the transistor 171A.

The source-follower transistor 142A and the row-select transistor 143A are configured to read out the output voltage VOUT1 to the bit-line BL-A according to the selecting signal SelA.

Similarly, the source-follower transistor 142B and the row-select transistor 143B are configured to read out the output voltage VOUT2 to the bit-line BL-B according to the selecting signal SelB.

FIG. 2D-2 illustrates the photo-detecting apparatus 200D with a structural view of the photodiode 172. The photodiode 172, in this embodiment, is a vertical-type photodiode, where a N-doped region N+ and a P-doped region P+ are configured in a vertical direction, and a light-absorption material (e.g., germanium Ge or germanium-silicon GeSi) is formed in-between the N-doped region N+ and the P-doped region P+. In some implementations, the light-absorption material formed in-between the N-doped region N+ and the P-doped region P+ is supported by the semiconductor substrate (e.g., silicon Si or silicon-germanium SiGe). On the other hands, in one implementation, the switch 171A, switch 171B and the photodiode 172 can be manufactured in the same chip, the rest of the elements can be manufactured in another chip. In one implementation, the photodiode 172 can be manufactured in the one chip, the rest of the elements can be manufactured in another chip. In one implementation, all the elements shown in FIG. 2D-2 can be manufactured in the same chip. Furthermore, the optical-to-electric converter 170 can be implemented by back-side incident (BSI) or front-side incident (FSI), which means the light IL can be received from the bottom of the chip or top of the chip.

Figures 1, 1I, 2, 3:
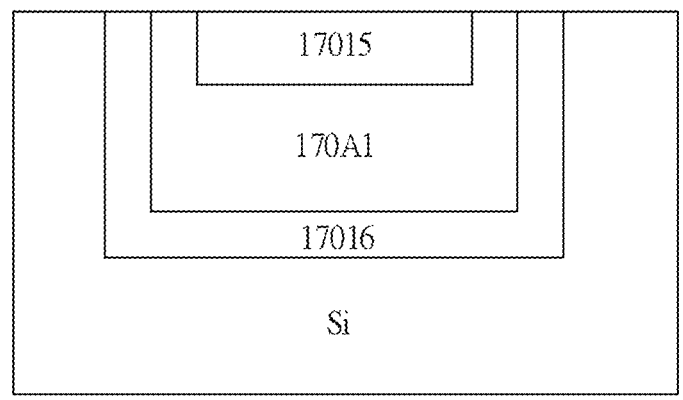
Figures 1, 1I, 2, 3, 4:
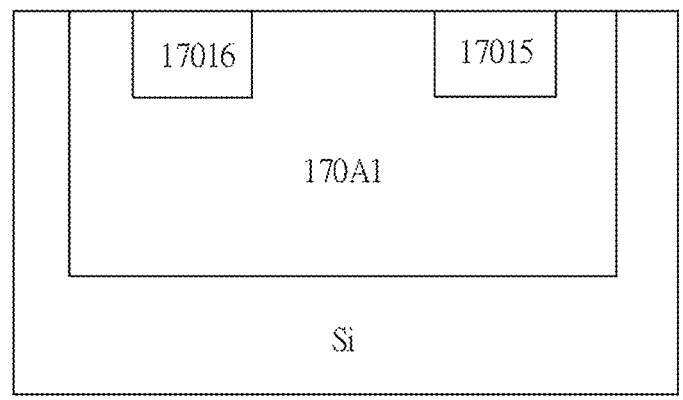
Figures 1, 1I, 2, 3, 4, 5:
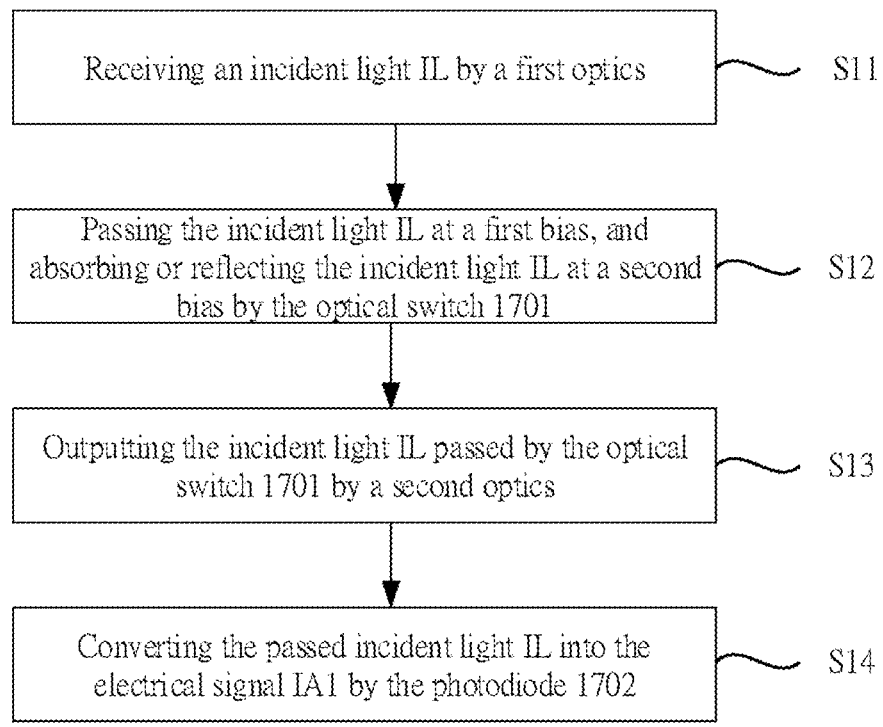
Figures 1, 1J:
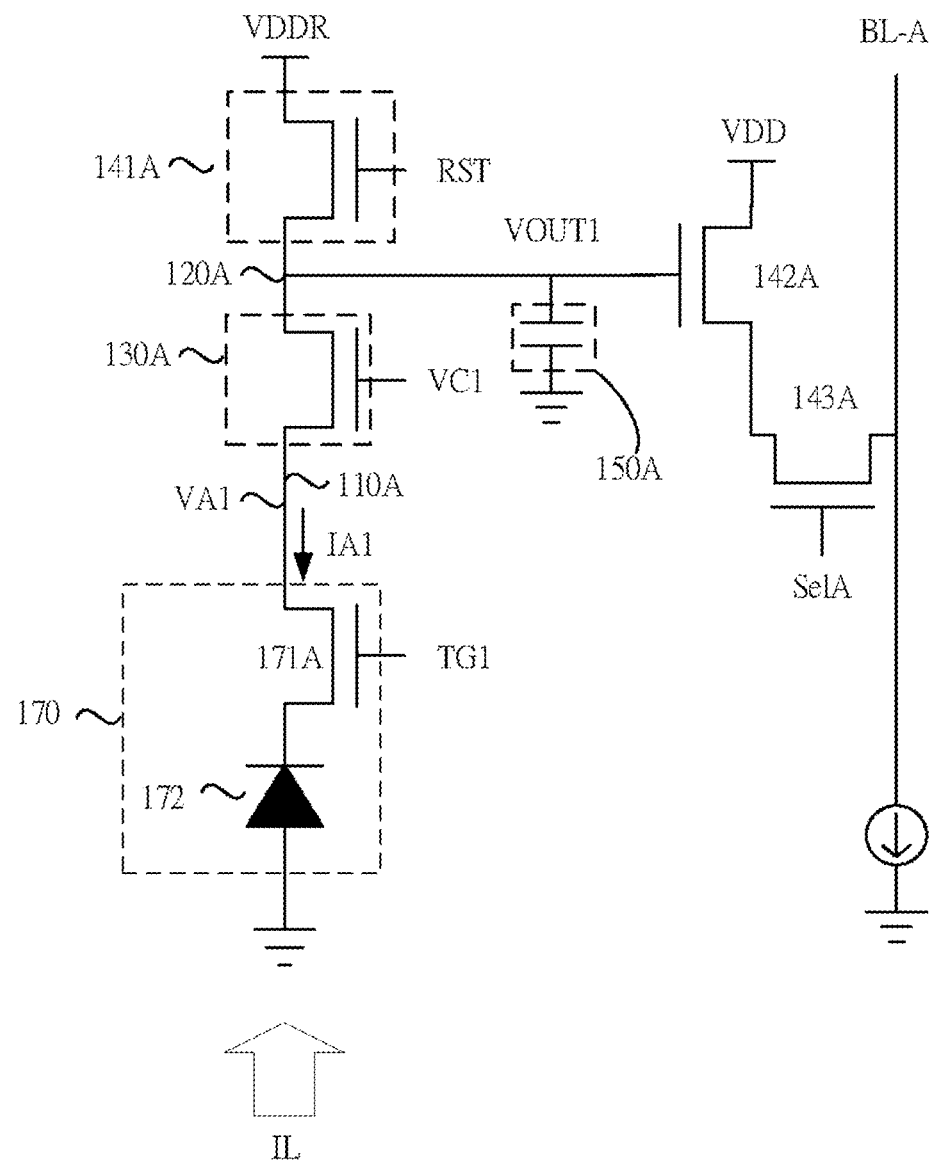
Figures 1, 1J, 2:
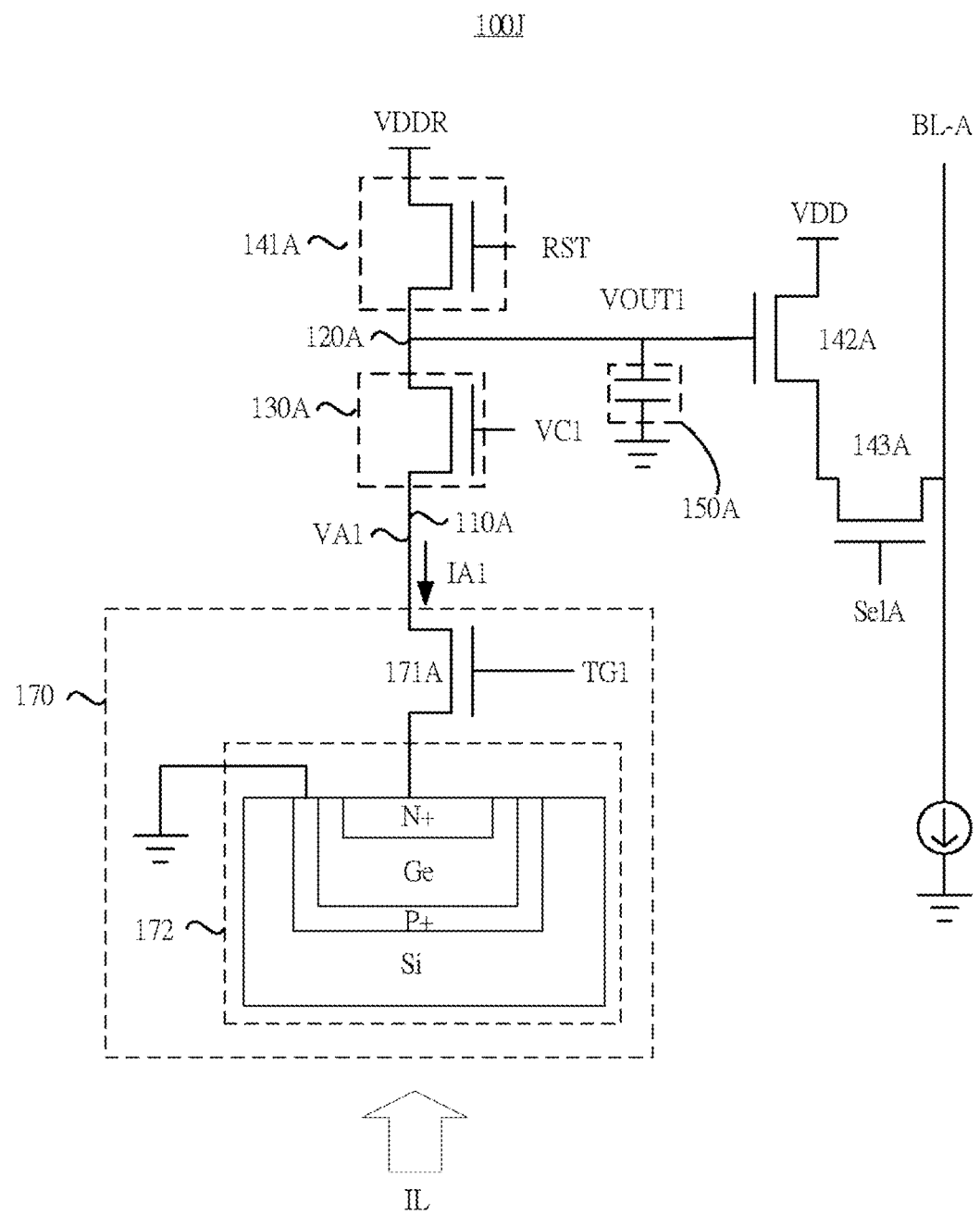
Figures 1, 1J, 2, 3:
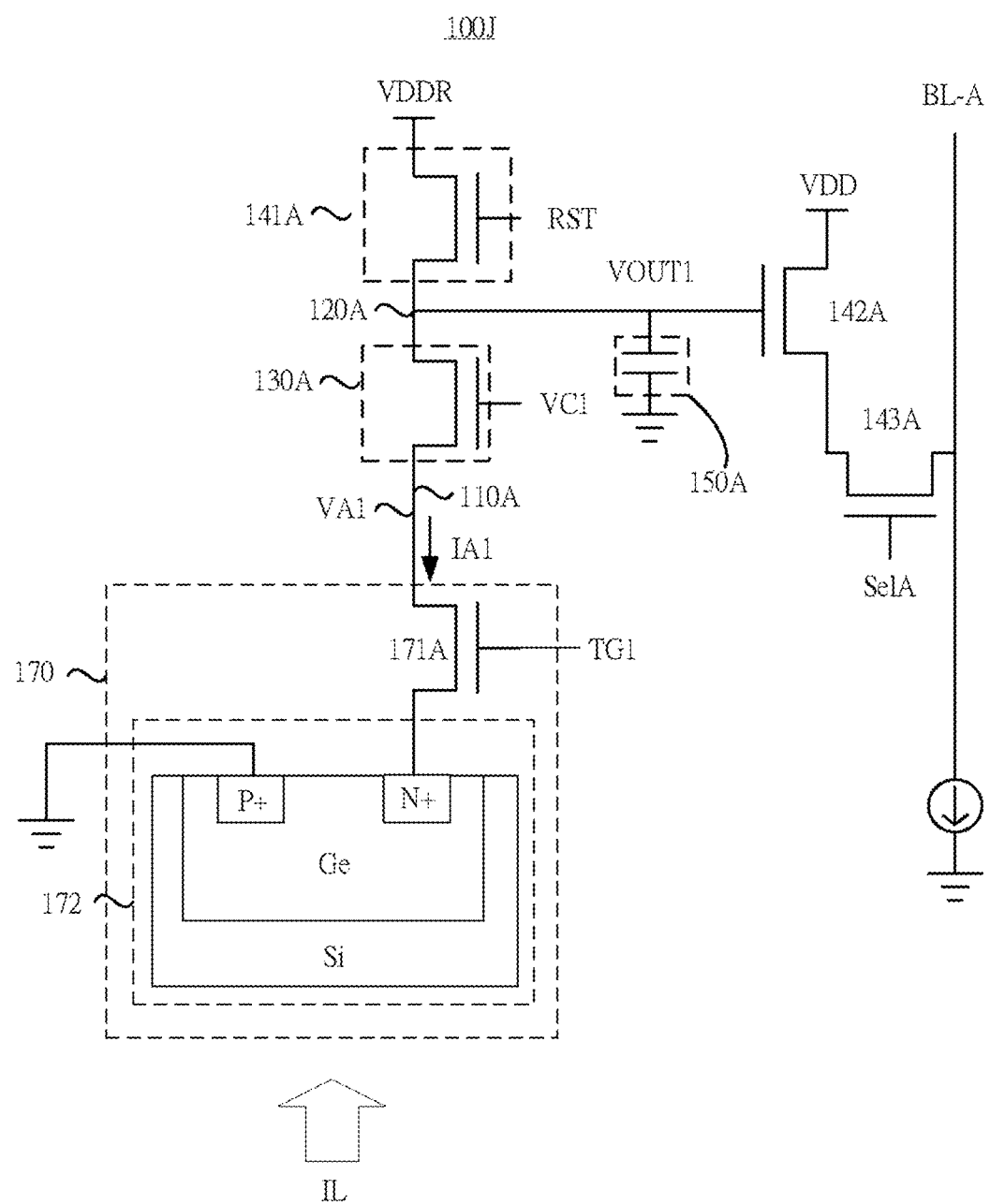
Figures 1, 1J, 2, 3, 4:
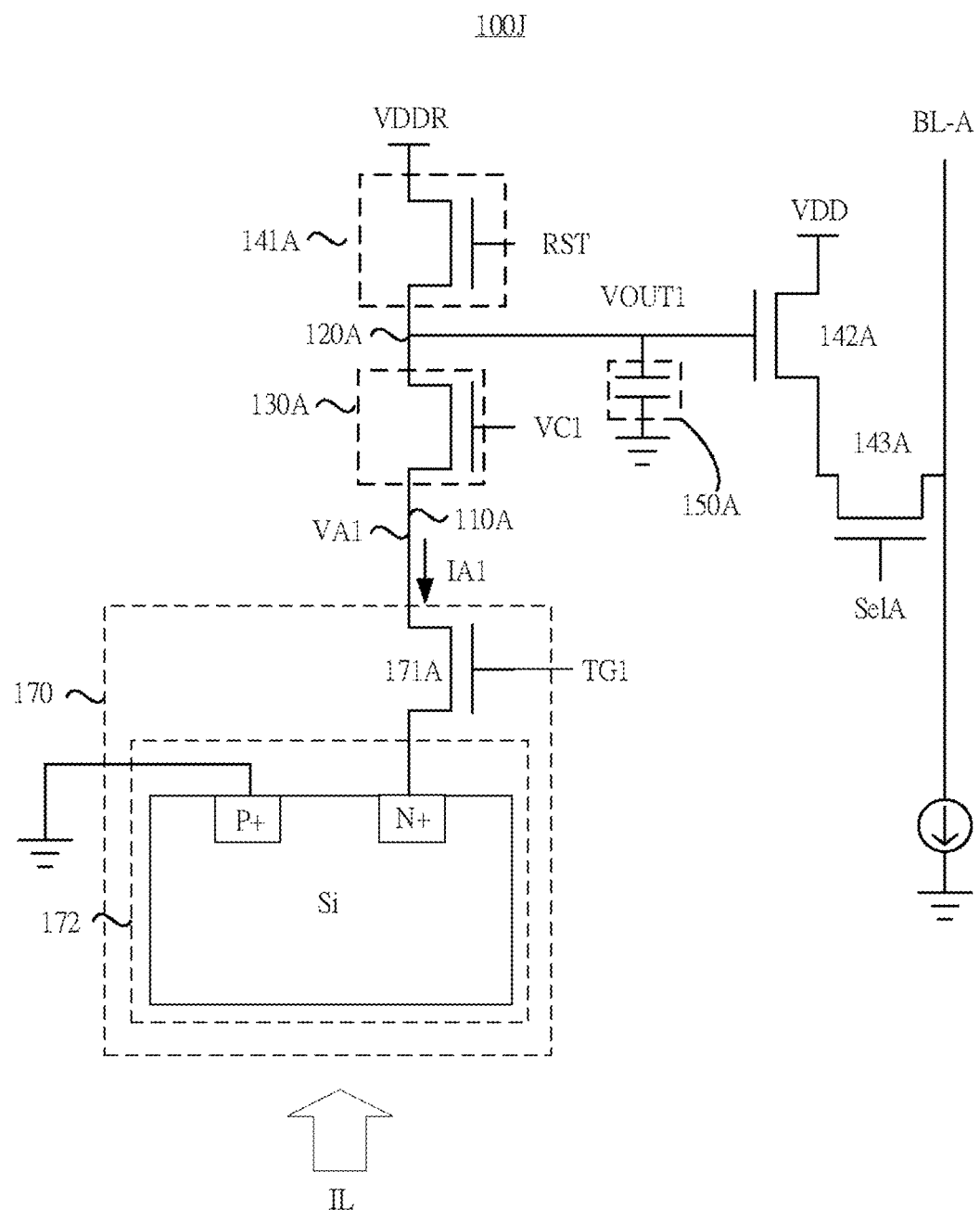

FIG. 2D-3 illustrates the photo-detecting apparatus 200D with a structural view of the photodiode 172. The photodiode 172, in this embodiment, is a horizontal-type photodiode, where a N-doped region N+ and a P-doped region P+ are configured in a horizontal direction, and a light-absorption material (e.g., germanium Ge) covers the N-doped region N+ and the P-doped region P+. In some implementations, the light-absorption material covers the N-doped region N+ and the P-doped region P+ at its surface, and is supported by the semiconductor substrate (e.g., silicon Si or silicon-germanium SiGe). On the other hands, in one implementation, the switch 171A, the switch 171B and the photodiode 172 can be manufactured in the same chip, the rest of the elements can be manufactured in another chip. In one implementation, the photodiode 172 can be manufactured in one chip, the rest of the elements can be manufactured in another chip. In one implementation, all the elements shown in FIG. 2D-3 can be manufactured in the same chip. Furthermore, the optical-to-electric converter 170 can be implemented by back-side incident (BSI) or front-side incident (FSI), which means the light IL can be received from the bottom of the chip or top of the chip.

FIG. 2D-4 illustrates the photo-detecting apparatus 200D with a structural view of the photodiode 172. The photodiode 172, in this embodiment, is a horizontal-type photodiode, where a N-doped region N+ and a P-doped region P+ are configured in a horizontal direction. Compared to FIG. 1D-3, this embodiment uses silicon semiconductor substrate as a light-absorption material. On the other hands, in one implementation, the switch 171A, 171B and the photodiode 172 can be manufactured in the same chip, the rest of the elements can be manufactured in another chip. In one implementation, the photodiode 172 can be manufactured in one chip, the rest of the elements can be manufactured in another chip. In one implementation, all the elements shown in FIG. 2D-4 can be manufactured in the same chip. Furthermore, the optical-to-electric converter 170 can be implemented by back-side incident (BSI) or front-side incident (FSI), which means the light IL can be received from the bottom of the chip or top of the chip.

FIG. 2A to FIG. 2D-4 illustrate the photo-detecting apparatuses with two-tap configuration, which can be used in 3D sensing application (e.g., ToF applications) or 2D sensing application (e.g., CIS applications). 3D sensing application uses demodulation signal to obtain the image depth information. However, 2D sensing application uses non-demodulation signal to obtain the image intensity information.

Other Implementations

Figure 3A:
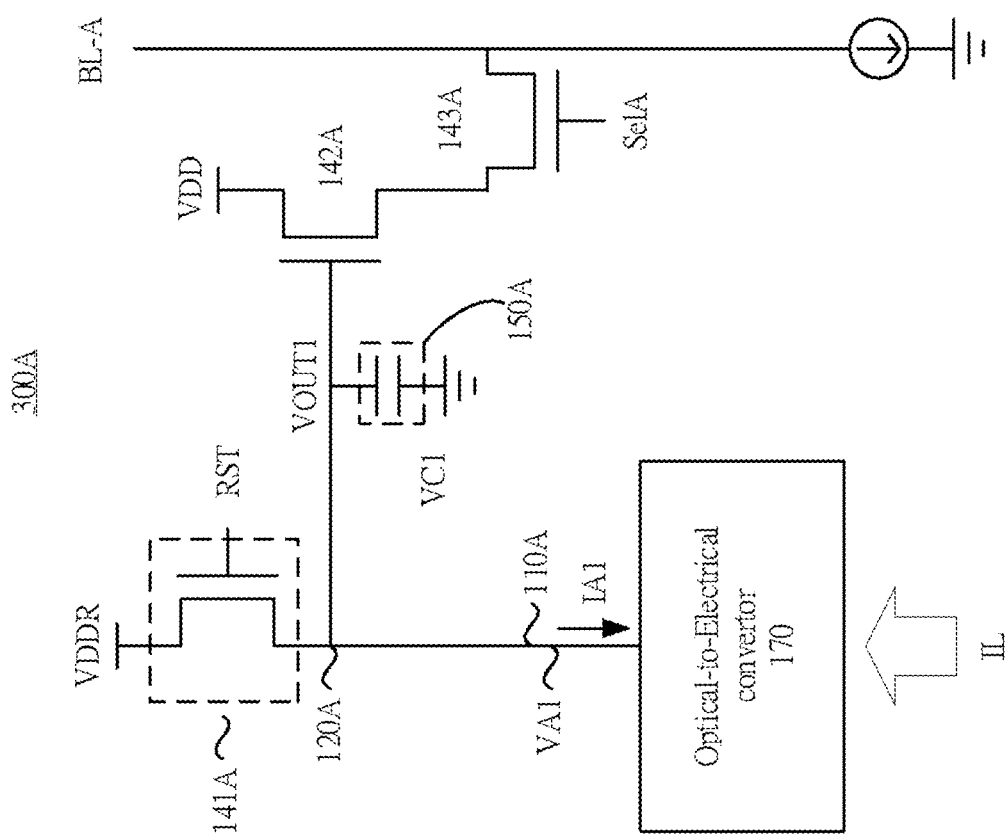
FIG. 3A-FIG. 3B illustrate the photo-detecting apparatuses without cascode transistor, according to some embodiments.
Figure 3B:
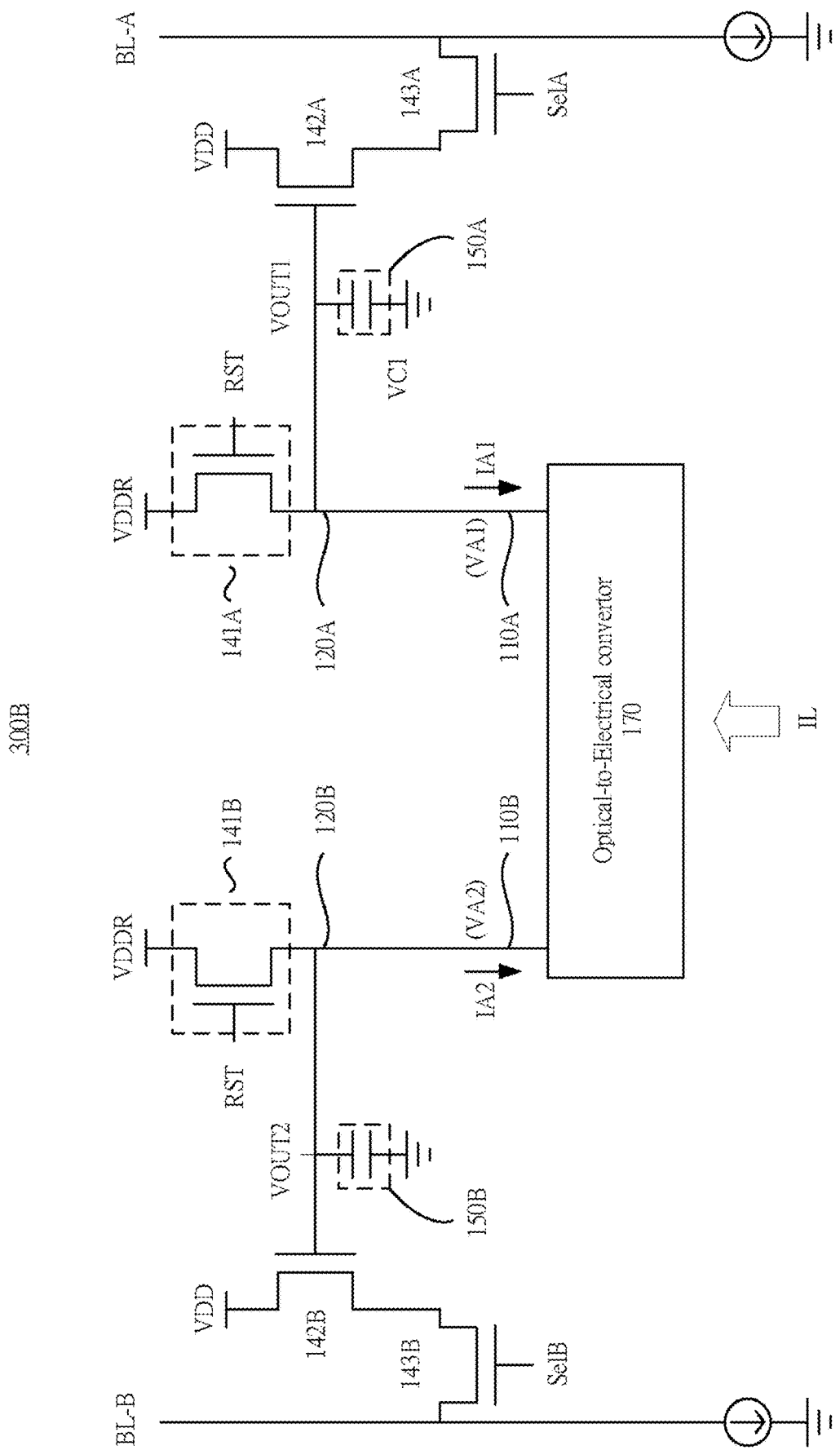

The photo-detecting apparatuses mentioned above include a cascode transistor (e.g., cascode transistor 130A or 130B) coupled between the optical-to-electric converter 170 and reset transistor (e.g., reset transistor 141A or 141B). In some implementations, the cascode transistor can be removed as illustrated in FIG. 3A and FIG. 3B. FIG. 3A is a photo-detecting apparatus 300A with one-tap configuration and FIG. 3B is a photo-detecting apparatus 300B with two-tap configuration. Similarly, the photo-detecting apparatus 300A and 300b can be configured to perform 2D or 3D sensing based on the signal characteristics of the switch signal TG1 and TG2.

Foregoing embodiments illustrate the photo-detecting apparatuses with either one-tap configuration or two-tap configuration. In some implementations, the tap number can be more than two. One may implement a 4-tap or more to configure a photo-detecting apparatus based on different design requirements.

Multi-Reset Mechanism

As the photo-detecting apparatus may be used in different environments, such as strong ambient light or weak ambient light, the dark current could be a factor to influence the stability. Below embodiments provide some solutions, using multi-reset mechanism, in which resetting the charge stored in the capacitor before the stored charge running-out so as to stabilize the photo-detecting apparatus.

Figure 4A:
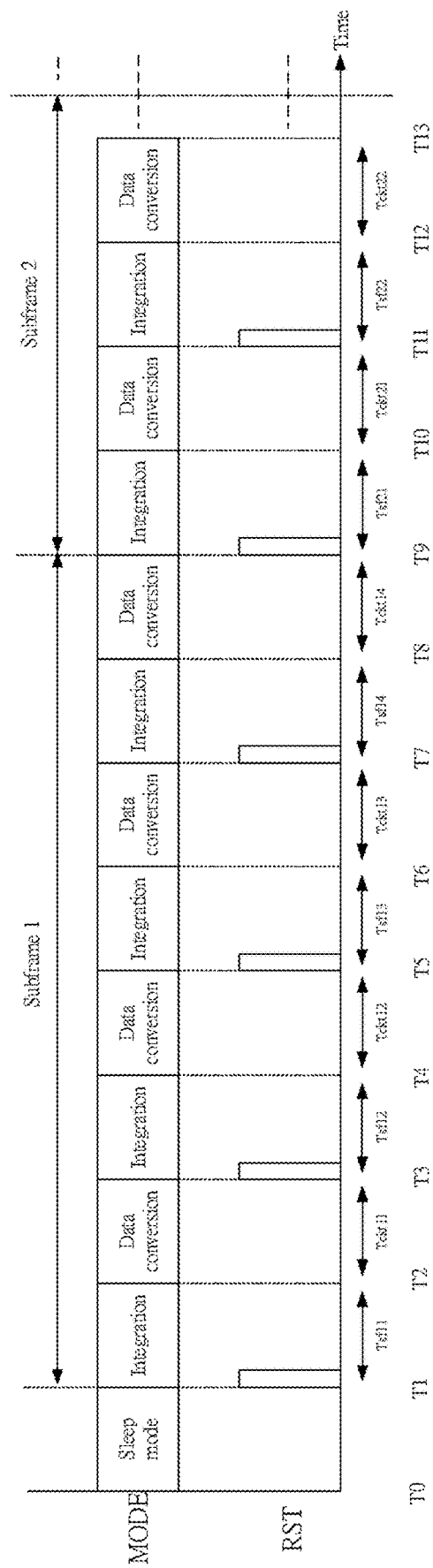
FIG. 4A-FIG. 4C illustrate the timing diagrams applying multi-reset mechanisms, according to some embodiments.

FIG. 4A is a timing diagram showing an operation of a photo-detecting apparatus. It is noted that this timing diagram can be applied to any embodiment of the photo-detecting apparatus, including 2D or 3D sensing applications, disclosed in this application. As illustrated in FIG. 4A, the photo-detecting apparatus includes sleep mode, integration mode and data conversion mode. At very first begging, the photo-detecting apparatus is operated under sleep mode, there is no operation during this period. To obtain the depth or intensity information for each subframe, multi-reset mechanism is applied. In other words, the resetting times of the reset signal RST is equal to or greater than two during a formation of a subframe. Assuming its timing is applied when the reset signal RST is asserted in, e.g., the photo-detecting apparatus 200A, the capacitors 150A and 150B will be charged to the voltage VDDR. Accordingly, the capacitors 150A and 150B will be discharged when the incident light IL comes in and the electrical signal IA1 and IA2 are generated. After an integration time (e.g., Tsf11), the voltages VOUT1 and VOUT2 will respectively drop to a settled voltage, and then these two settled voltages can be respectively read out to the bit-lines BL-A and BL-B during data conversion period. In this embodiment, one subframe (e.g., Subframe 1) is obtained after four times (e.g., timings T1, T3, T5 and T7) reset signals RST. In other words, the depth or intensity information of each pixel of each subframe is obtained based on four settled voltages (e.g., the settled voltages at timings T2, T4, T6 and T8). After a plurality of subframes are obtained, a final 3D frame can be obtained according to these subframes (e.g., 20 subframes, 40 subframes, 60 subframes or other numbers of subframes). For example, the final 3D frame can be obtained according to an average of these subframes, an average of particular frames, or providing different weighting for each subframe. Similar calculation and approach can be applied to 2D sensing. Through these calculations over the subframes, the accuracy of the final 2D/3D frame can be increased. While this embodiment takes four reset signals RST as illustration, one may use two or more reset signals RST to obtain one subframe. On the other hands, this multi-reset mechanism can be used in one-tap, two-tap or more taps configurations. Furthermore, the reset frequency can be configured as fixed or dynamic according to the design requirements.

Figure 4B:
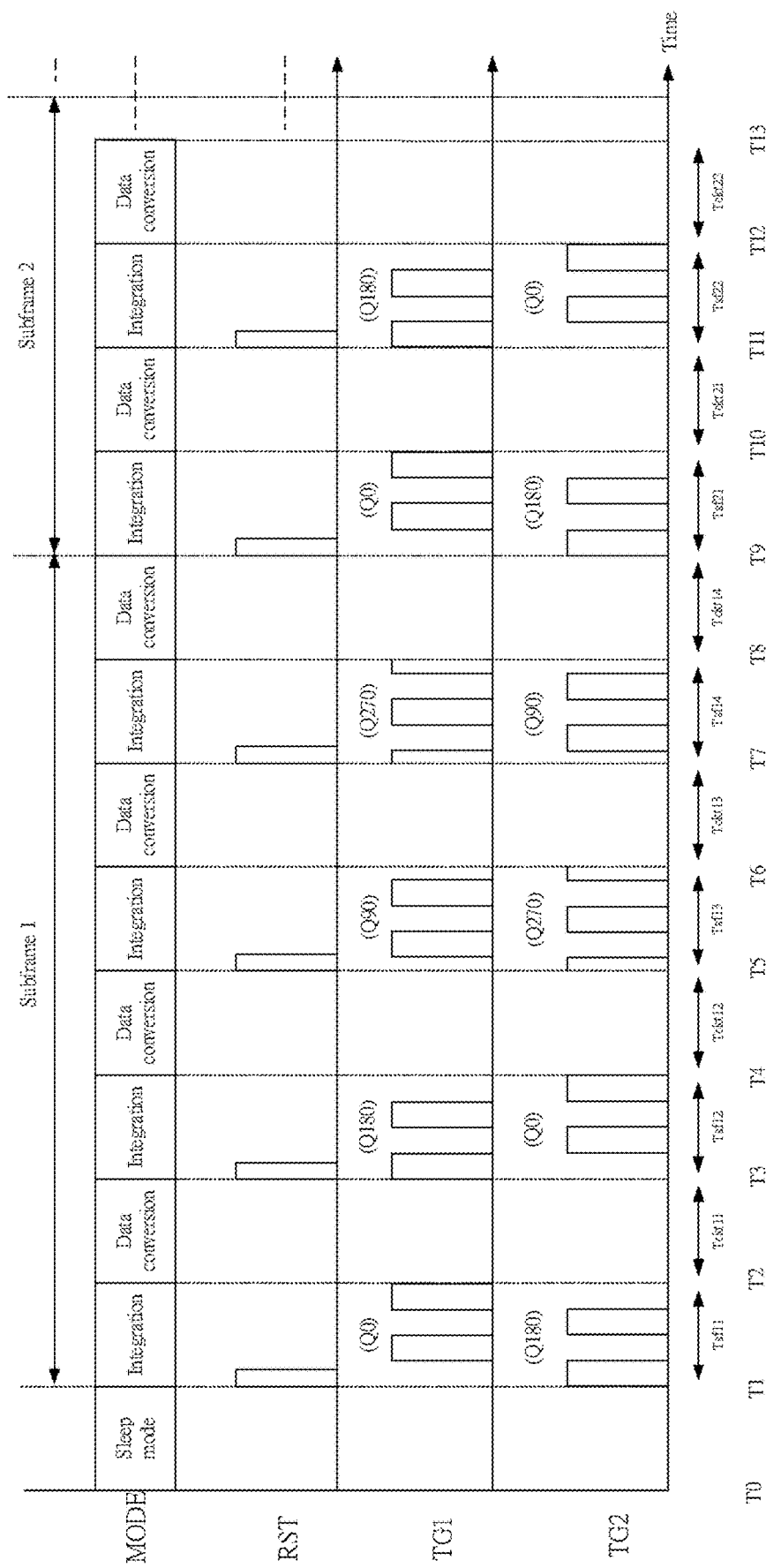

FIG. 4B illustrates a timing diagram for a photo-detecting apparatus used in 3D sensing application, which is used for sending image depth. As shown in FIG. 4B, switch signals TG1 and TG2 are demodulation signals. In this embodiment, demodulation signal (e.g. switch signal TG1 or TG2) is a continuous square wave signal during an integration operation. Specifically, the demodulation signal has phase offsets. In this embodiment, each switch signal TG1 or TG2 includes offsets of four phases (0-degree, 180-degree, 90-degree and 270-degree). Said the offsets of the four phases will be applied in turn. Taking switch signal TG1 as an example, the switch signal TG1 applies phase 0-degree during time period Tsf11, applies phase 180-degree during time period Tsf12, applies phase 90-degree during time period Tsf13, applies phase 270-degree during time period Tsf14 and so forth. The switch signal TG2 is a reversed signal of switch signal TG1. One may only use switch signal TG1 if the photo-detecting apparatus is a one-tap configuration. Applying the phase-offset switch signal, the image depth information can be obtained with enhanced accuracy.

Figure 4C:
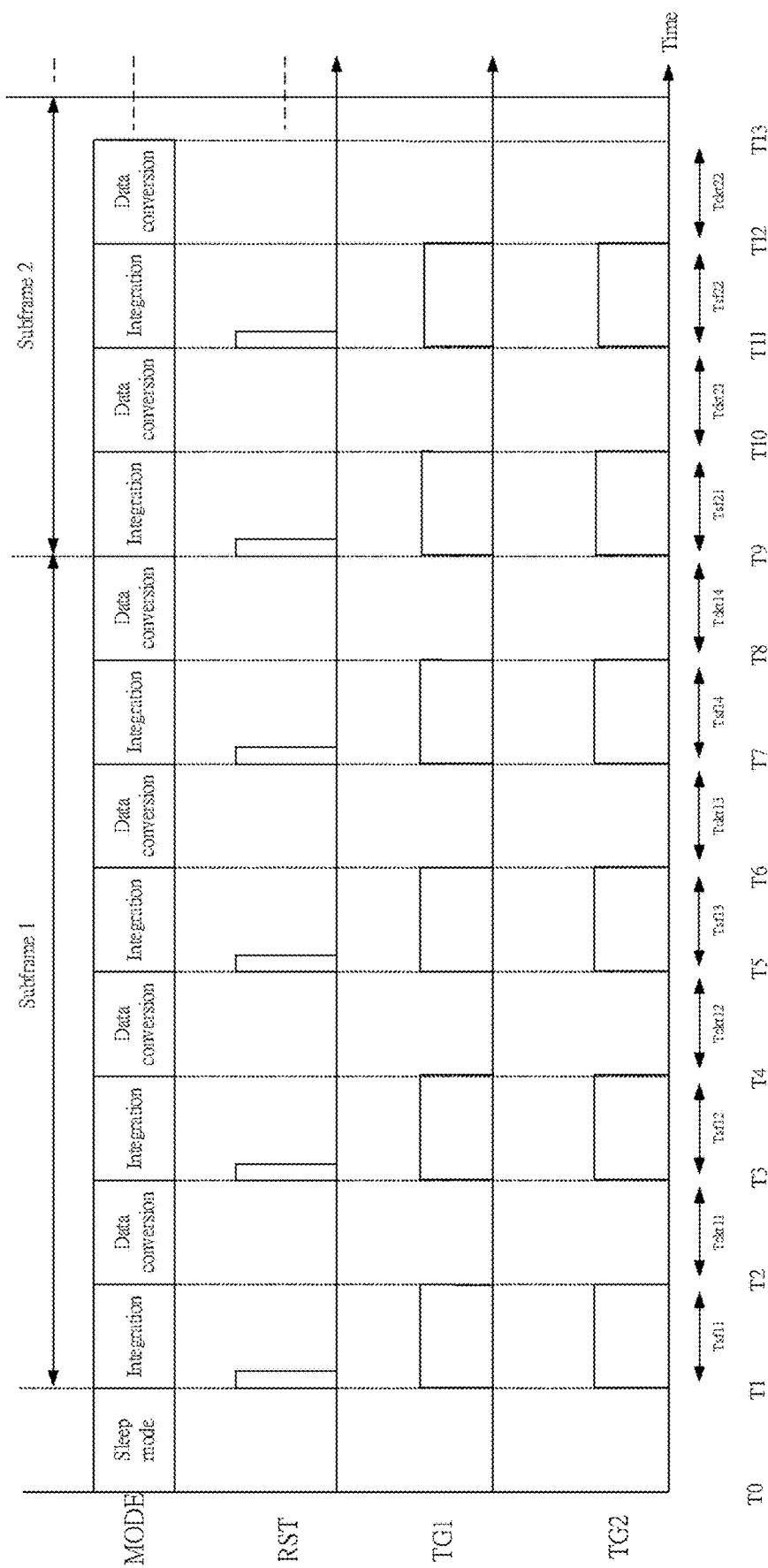

FIG. 4C illustrates a timing diagram for a photo-detecting apparatus used in 2D sensing application, which is used for sensing image intensity. As shown in FIG. 4C, switch signals TG1 and TG2 are the same and non-demodulation signals. In this embodiment, the switch signals TG1 and TG2 are turns-on signals for turning-on the switch 171A and 171B simultaneously during an integration operation so that the photo-detecting apparatus as in FIG. 2D-1 to FIG. 2D-4 can obtain the image intensity. In one implementation, one may only use switch signal TG1 if the photo-detecting apparatus is a one-tap configuration as in FIG. 1J-1 to 1J-4. In another implementation, one may use the switch signal TG1 and disable the switch signal TG2 if the photo-detecting apparatus as in FIG. 2D-1 to FIG. 2D-4 is a two-tap configuration.

In accordance with the foregoing embodiments, this application integrates the cascode transistor coupled between the reset transistor and the optical-to-electric converter, where the cascode transistor is capable of providing a low-level constant voltage at the output terminal of the optical-to-electric converter and being configured as a current buffer. With this configuration, the dark current generated by the optical-to-electric converter can be reduced and the signal-to-noise ratio is accordingly increased.

In some implementations, the optical-to-electric converter uses a light-absorption material formed on a semiconductor substrate, where the light-absorption material is different from the semiconductor substrate. For example, Ge-on-Si technology uses the light-absorption material $Ge_{(1-x)}Si_x$, wherein $0 \le x < 1$, formed on the silicon semiconductor substrate to absorb the incident light. This technology is capable of absorbing the light having a longer NIR wavelength (e.g., the wavelength is greater than 940 nm, even more than 1100 nm) and therefore protect the human eyes.

Furthermore, using multi-reset mechanism in the photo-detecting apparatus can prevent from the charge run-out problem and increase the stability of the photo-detecting apparatus. In addition, the phase-offset switch signal is also introduced to obtain the image depth information with enhanced accuracy.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A photo-detecting apparatus, comprising:
   an optical-to-electric converter, having a first output terminal, configured to convert an incident light to an electrical signal;
   a cascode transistor, having a control terminal, a first channel terminal and a second channel terminal, wherein the second channel terminal of the cascode transistor is coupled to the first output terminal of the optical-to-electric converter; and a reset transistor, having a control terminal, a first channel terminal and a second channel terminal, wherein the first channel terminal of the reset transistor is coupled to a supply voltage and the second channel terminal of the reset transistor is coupled to the first channel terminal of the cascode transistor, wherein the control terminal of the reset transistor is coupled to a reset signal configured to issue, within a subframe and based on a reset frequency, multiple reset signals at multiple corresponding resetting times to the control terminal of the reset transistor, and wherein, after each of the multiple reset signals is issued to the control terminal of the reset transistor at a corresponding resetting time of the multiple corresponding resetting times within the subframe, the first channel terminal of the cascode transistor is configured to provide, to a bit-line, a respective settled voltage that represents an integration of the electrical signal converted by the optical-to-electric converter.

2. The photo-detecting apparatus of claim 1, wherein the first output terminal of the optical-to-electric converter is substantially operated at a constant voltage.

3. The photo-detecting apparatus of claim 1, wherein the optical-to-electric converter includes a light-absorption material formed on a semiconductor substrate, wherein the light absorption material is a material different from the semiconductor substrate.

4. The photo-detecting apparatus of claim 3, wherein the light-absorption material is $Ge_{1-x}Si_x$, where $0 \leq x < 1$, and the semiconductor substrate is silicon.

5. The photo-detecting apparatus of claim 1, wherein the optical-to-electric converter further comprising:
a photodiode configured to convert the incident light to the electrical signal;
a first switch configured to output the electrical signal to the first output terminal according to a first switch signal; and
a second switch configure to output the electrical signal to a second output terminal according to a second switch signal.

6. The photo-detecting apparatus of claim 5, wherein the photodiode includes a n-doped and a p-doped region, wherein the n-doped and the p-doped region are formed in a vertical direction.

7. The photo-detecting apparatus of claim 5, wherein the photodiode includes a n-doped and a p-doped region, wherein the n-doped and the p-doped region are formed in a horizontal direction.

8. The photo-detecting apparatus of claim 5, wherein the first switch signal is a demodulation signal.

9. The photo-detecting apparatus of claim 8, wherein the demodulation signal is applied with a phase offset.

10. The photo-detecting apparatus of claim 1, further comprising a voltage generator, having an operation amplifier, to control voltages generated at the first output terminal of the optical-to-electric converter and a second output terminal of the optical-to-electric converter.

11. The photo-detecting apparatus of claim 1, wherein the optical-to-electric converter further comprising:
an optical switch, configured to gate or pass the incident light; and
a photodiode, configured to convert the incident light passed by the optical switch into the electrical signal.

12. The photo-detecting apparatus of claim 11, wherein the optical switch Includes an electro-absorption material, a first transparent conductive material and a second transparent conductive material; and the electro-absorption material is positioned in-between the first transparent conductive material and the second transparent conductive material.

13. The photo-detecting apparatus of claim 1, wherein the control terminal of the reset transistor is configured to receive a reset signal, wherein the resetting times of the reset signal is equal to or greater than two during a formation of a subframe.

14. The photo-detecting apparatus of claim 1 is configured to form a final 3D frame, wherein the final 3D frame is obtained according to a plurality of subframes.

15. The photo-detecting apparatus of claim 14, wherein the final 3D frame is obtained according to a weighted average of the plurality of subframes.

16. The photo-detecting apparatus of claim 1, further comprising:
a capacitor coupled between the second channel terminal of the reset transistor and the bit-line.

17. The photo-detecting apparatus of claim 16,
wherein the reset signal is configured to issue the multiple reset signals at the multiple corresponding resetting times within the subframe to the control terminal of the reset transistor to recharge the capacitor to a reset voltage, and
wherein the capacitor is configured to, after each of the multiple reset signals is issued to the control terminal of the reset transistor at a corresponding resetting time of the multiple corresponding resetting times within the subframe, be discharged from the reset voltage to the respective settled voltage during the integration of the electrical signal converted by the optical-to-electrical converter.

* * * * *